United States Patent
Benz et al.

(10) Patent No.: US 10,797,684 B1
(45) Date of Patent: Oct. 6, 2020

(54) SUPERCONDUCTING WAVEFORM SYNTHESIZER

(71) Applicant: Government of the United States of America, as represented by the Secretary of Commerce, Gaithersburg, MD (US)

(72) Inventors: Samuel Paul Benz, Superior, CO (US); Justus Albert Brevik, Boulder, CO (US); Manuel Angel Castellanos Beltran, Broomfield, CO (US); Paul David Dresselhaus, Louisville, CO (US); Peter Farrell Hopkins, Boulder, CO (US); Christine Annette Donnelly, Boulder, CO (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 0 days.

(21) Appl. No.: 16/436,062

(22) Filed: Jun. 10, 2019

Related U.S. Application Data

(60) Provisional application No. 62/845,397, filed on May 9, 2019.

(51) Int. Cl.
H03K 3/38 (2006.01)
(52) U.S. Cl.
CPC ...................................... H03K 3/38 (2013.01)

(58) Field of Classification Search
None
See application file for complete search history.

(56) References Cited

U.S. PATENT DOCUMENTS 5,812,078 A * 9/1998 Przybysz .............. H03M 3/404
341/133
6,236,344 B1 5/2001 Benz et al.
(Continued)

OTHER PUBLICATIONS

Brevik, J., et al., "Josephson Arbitrary Waveform Synthesis with Multilevel Pulse Biasing", IEEE Transactions on Applied Superconductivity, 2017, 1301707, vol. 27 No. 3.
(Continued)

Primary Examiner — Lincoln D Donovan
Assistant Examiner — Khareem E Almo
(74) Attorney, Agent, or Firm — Office of Chief Counsel for National Institute of Standards and Technology

(57) ABSTRACT

A superconducting waveform synthesizer produces an arbitrary waveform and includes an encoder that produces a bitstream; a pattern generator that produces a current bias pulse from the bitstream; a Josephson junction that produces a quantized output pulse from the current bias pulse; and a converter that produces an arbitrary waveform from the quantized output pulse. A process for producing an arbitrary waveform includes producing a bitstream; producing a current bias pulse from the bitstream; communicating the current bias pulse to a Josephson junction; producing, by the Josephson junction, a quantized output pulse from the current bias pulse; producing a quantized output pulse from the current bias pulse; and producing an arbitrary waveform from the quantized output pulse.

23 Claims, 17 Drawing Sheets

(56) References Cited

U.S. PATENT DOCUMENTS

| | | | | |
|---|---|---|---|---|
| 2007/0052441 | A1* | 3/2007 | Taguchi | H03K 3/38 |
| | | | | 326/3 |
| 2008/0129368 | A1* | 6/2008 | Furuta | H03K 17/92 |
| | | | | 327/367 |
| 2019/0296743 | A1* | 9/2019 | Pedram | H03K 19/1774 |

OTHER PUBLICATIONS

Flowers-Jacobs, N.E., et al., "Two-Volt Josephson Arbitrary Waveform Synthesizer Using Wilkinson Dividers", IEEE Transactions on Applied Superconductivity, 2016, vol. 26 No. 6.

Watanabe, T., et al., "Modified Double-Flux-Quantum Amplifier for Bipolar Voltage Multiplication", IEEE, 2015.

Brevik, J., et al., "Radio-Frequency Waveform Synthesis with the Josephson Arbitrary Waveform Synthesizer", IEEE: 2018 Conference on Precision Electromagnetic Measurements (CPEM 2018), 2018, p. 1-2.

* cited by examiner

SUPERCONDUCTING WAVEFORM SYNTHESIZER

CROSS REFERENCE TO RELATED APPLICATIONS

The application claims priority to U.S. Provisional Patent Application Ser. No. 62/845,397 filed May 14, 2019, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov; reference NIST Docket Number 18-038US1.

BRIEF DESCRIPTION

Disclosed is a superconducting waveform synthesizer to produce an arbitrary waveform, the superconducting waveform synthesizer comprising: a primary Josephson junction (JJ) that: receives a primary current bias pulse; and produces a primary quantized output pulse from the primary current bias pulse; a secondary Josephson junction that: receives a secondary current bias pulse; and produces a secondary quantized output pulse from the secondary current bias pulse; a combiner that: receives the primary quantized output pulse from the primary Josephson junction; receives the secondary quantized output pulse from the secondary Josephson junction; and produces a quantized pulse pattern from a combination of the primary quantized output pulse and the secondary quantized output pulse; a converter that: receives the quantized pulse pattern from the combiner; and produces the arbitrary waveform from the converter.

Disclosed is a superconducting waveform synthesizer to produce an arbitrary waveform, the superconducting waveform synthesizer comprising: an encoder that produces a bitstream; a pattern generator that receives the bitstream from the encoder and produces a primary current bias pulse from the bitstream; a primary Josephson junction that receives the primary current bias pulse from the pattern generator and produces a primary quantized output pulse from the primary current bias pulse; and a converter that receives the primary quantized output pulse from the primary Josephson junction and produces an arbitrary waveform from the primary quantized output pulse.

Disclosed is a process for producing an arbitrary waveform with the superconducting waveform synthesizer, the process comprising: producing a bitstream; producing a primary current bias pulse from the bitstream; communicating the primary current bias pulse to a primary Josephson junction; receiving, by the primary Josephson junction, the primary current bias pulse; producing, by the primary Josephson junction, a primary quantized output pulse from the primary current bias pulse; producing a primary quantized output pulse from the primary current bias pulse; and producing an arbitrary waveform from the primary quantized output pulse.

Disclosed is a process for producing an arbitrary waveform, the process comprising: communicating a primary current bias pulse to a primary Josephson junction; receiving, by the primary Josephson junction, the primary current bias pulse; producing, by the primary Josephson junction, a primary quantized output pulse from the primary current bias pulse; communicating a secondary current bias pulse to a secondary Josephson junction; receiving, by the secondary Josephson junction, the secondary current bias pulse; producing, by the secondary Josephson junction, a secondary quantized output pulse from the secondary current bias pulse; combining the primary quantized output pulse and the secondary quantized output pulse to produce a quantized pulse pattern; and converting the quantized pulse pattern to the arbitrary waveform to produce the arbitrary waveform.

BRIEF DESCRIPTION OF THE DRAWINGS

The following description should not be considered limiting in any way. With reference to the accompanying drawings, like elements are numbered alike.

DETAILED DESCRIPTION

Figure 1:
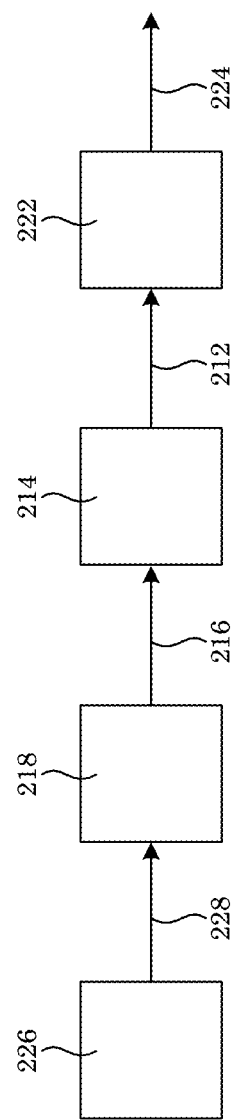
FIG. 1 shows a superconducting waveform synthesizer.

A detailed description of one or more embodiments is presented herein by way of exemplification and not limitation.

It has been discovered that a superconducting waveform synthesizer herein produces a pulse voltage output that is immune to differential pulse timing shifts. The superconducting waveform synthesizer can include arrays of one or more Josephson junctions such that, when output pulse patterns encode a waveform, the waveform is free from pulse timing shifts that degrade the accuracy and signal purity of the synthesized waveform. Advantageously and unexpectedly, a bipolar realization with two arrays eliminate dc offsets from output signals and can include two independent, electrically connected and sampled Josephson junction arrays.

The superconducting waveform synthesizer provides quantum-accurate voltage waveform synthesis for AC voltage metrology and programmable arbitrary waveform synthesis for RF applications, e.g., as a megahertz or gigahertz calibration source for LTE or 5G communications. The superconducting waveform synthesizer can be a driver for bias or as a controller for another circuit or device such as a pulse bias control or for characterization of a qubit or data input applied to a superconducting or other computer such as a digital, quantum, reversible, or neuromorphic processor.

Superconducting waveform synthesizer 200 produces an arbitrary waveform 224. In an embodiment, with reference to FIG. 1, superconducting waveform synthesizer 200 includes encoder 226 that produces bitstream 228; pattern generator 218 that receives bitstream 228 from encoder 226 and produces primary current bias pulse 216.1 from bitstream 228; primary Josephson junction 214.1 that receives primary current bias pulse 216.1 from pattern generator 218 and produces primary quantized output pulse 212.1 from primary current bias pulse 216.1; and converter 222 that receives primary quantized output pulse 212.1 from primary Josephson junction 214.1 and produces arbitrary waveform 224 from primary quantized output pulse 212.1.

Figure 2:
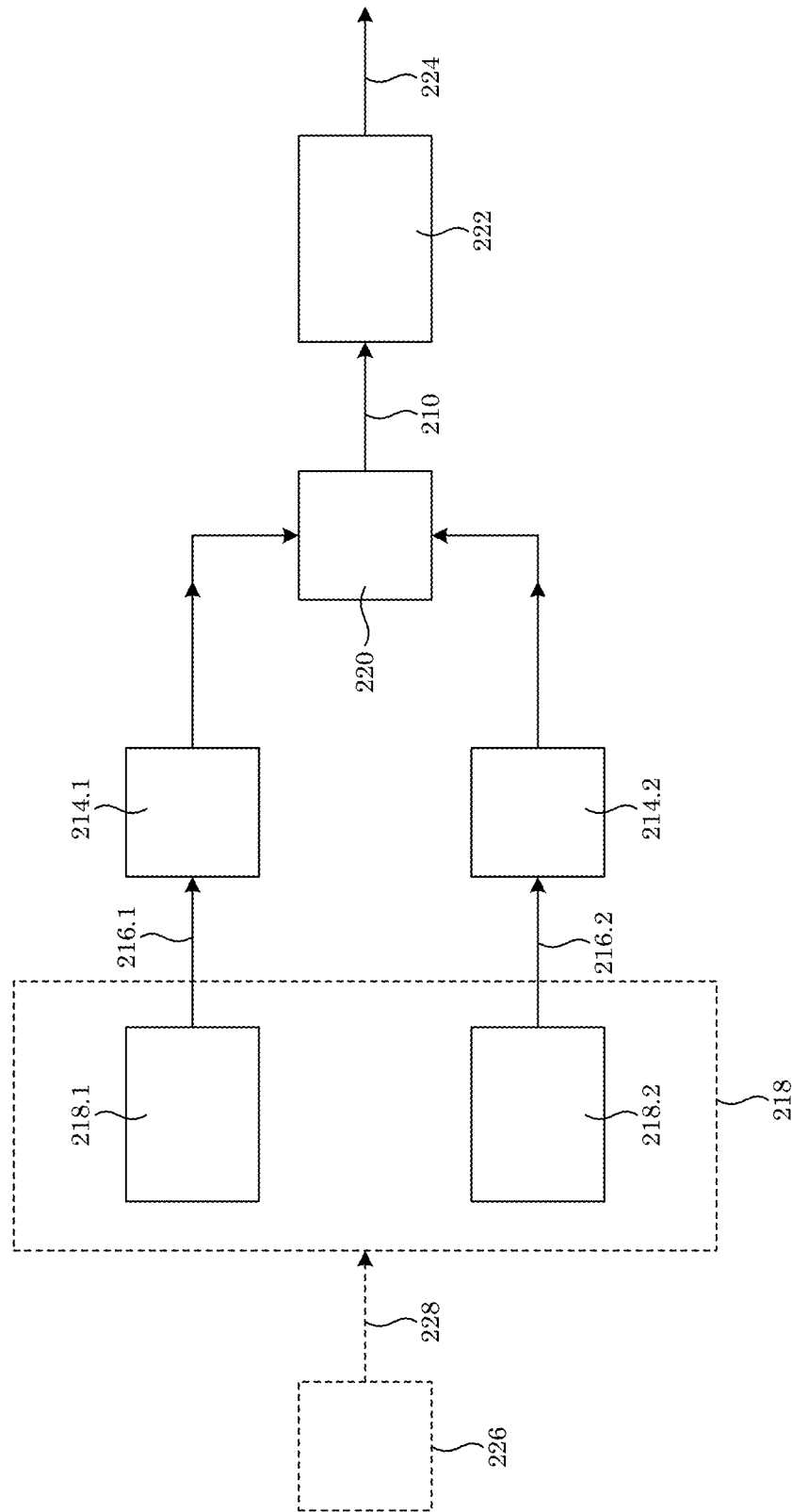
FIG. 2 shows a superconducting waveform synthesizer.

In an embodiment, with reference to FIG. 2, superconducting waveform synthesizer 200 includes primary Josephson junction 214.1 that receives primary current bias pulse 216.1 and produces primary quantized output pulse 212.1 from primary current bias pulse 216.1; secondary Josephson junction 214.2 that receives secondary current bias pulse 216.2 and produces secondary quantized output pulse 212.2 from secondary current bias pulse 216.2; combiner 220 that receives primary quantized output pulse 212.1 from primary Josephson junction 214.1, receives secondary quantized output pulse 212.2 from secondary Josephson junction 214.2, and produces quantized pulse pattern 210 from a combination of primary quantized output pulse 212.1 and secondary quantized output pulse 212.2; and converter 222 that receives quantized pulse pattern 210 from combiner 220 and produces arbitrary waveform 224 from converter 222. Superconducting waveform synthesizer 200 further can include encoder 226 that produces bitstream 228 and communicates bitstream 228 to pattern generator 218 that includes primary generator 218.1 and secondary generator 218.2.

Encoder 226 produces bitstream 228. Encoder 226 can include a method or system to encode arbitrary waveform 224 and can be implemented using software or hardware. Exemplary encoders 226 include pulse-density modulation encoders and delta-sigma modulation encoding algorithms implemented in software, or hardware devices such as delta-sigma modulator encoders, superconducting digital circuits, or field-programmable gate arrays. Moreover, encoder 226 can employ a method for determining bitstream 228 for optimizing the characteristics of arbitrary waveform 224, such as its signal and quantization error, and can adjust or correct for nonlinear response, attenuation, reflections and feedthrough signals of pattern generator 218, current bias pulse 216, and primary Josephson junction 214, and can include additional filtering techniques, such as predistortion and zero compensation. A number of encoders 226 (e.g., 226.1, 226.2, . . . , 226.n, wherein n is an integer number of total encoders 226) can be from one to 100, specifically from one to 10, and more specifically from one to four. In an embodiment, encoder 226 includes a software implementation of a delta-sigma modulation algorithm including a predistortion and zero compensation filter to produce a bitstream for each pattern generator used.

Bitstream 228 can include a multilevel pattern produced by encoder 226 that encodes an arbitrary waveform such that the quantized output pulse 212 generated by Josephson junction 214 has the pulse pattern to represent the desired waveform and can be a pattern of discrete pulses represented by impulse functions of one or more levels and one or both polarities, or a pattern that can include extra beneficial signals and features in addition to the pulses that are implemented with filters or predistortion that do not cause Josephson junction 214 to generate quantized output pulse 212. Moreover, bitstream 228 can have a variable length that will encode a variable number of periods, or fraction thereof, of arbitrary waveform 224, and bitstream 228 can have different output levels that cause Josephson junction 214 to generate quantized output pulse 212 such that the quantization number varies over the bitstream. A sampling frequency of bitstream 228 can be from 1 pulse-per-second to 20 terapulses-per-second, specifically from 10 gigapulses-per-second to 100 gigapulses-per-second, and more specifically from 10 gigapulses-per-second to 30 gigapulses-per-second. In an embodiment, bitstream 228 includes a pattern of bipolar pulses represented by sample levels −1, 0 and +1 to encode one or more waveform periods with each +/−1 pulse bracketed by two opposite polarity half-pulses represented by sample levels −0.5 and +0.5 for the benefit of reducing the signal of the desired synthesis frequencies in bitstream 228 to reduce the feedthrough error in the synthesized waveform.

Figure 4:
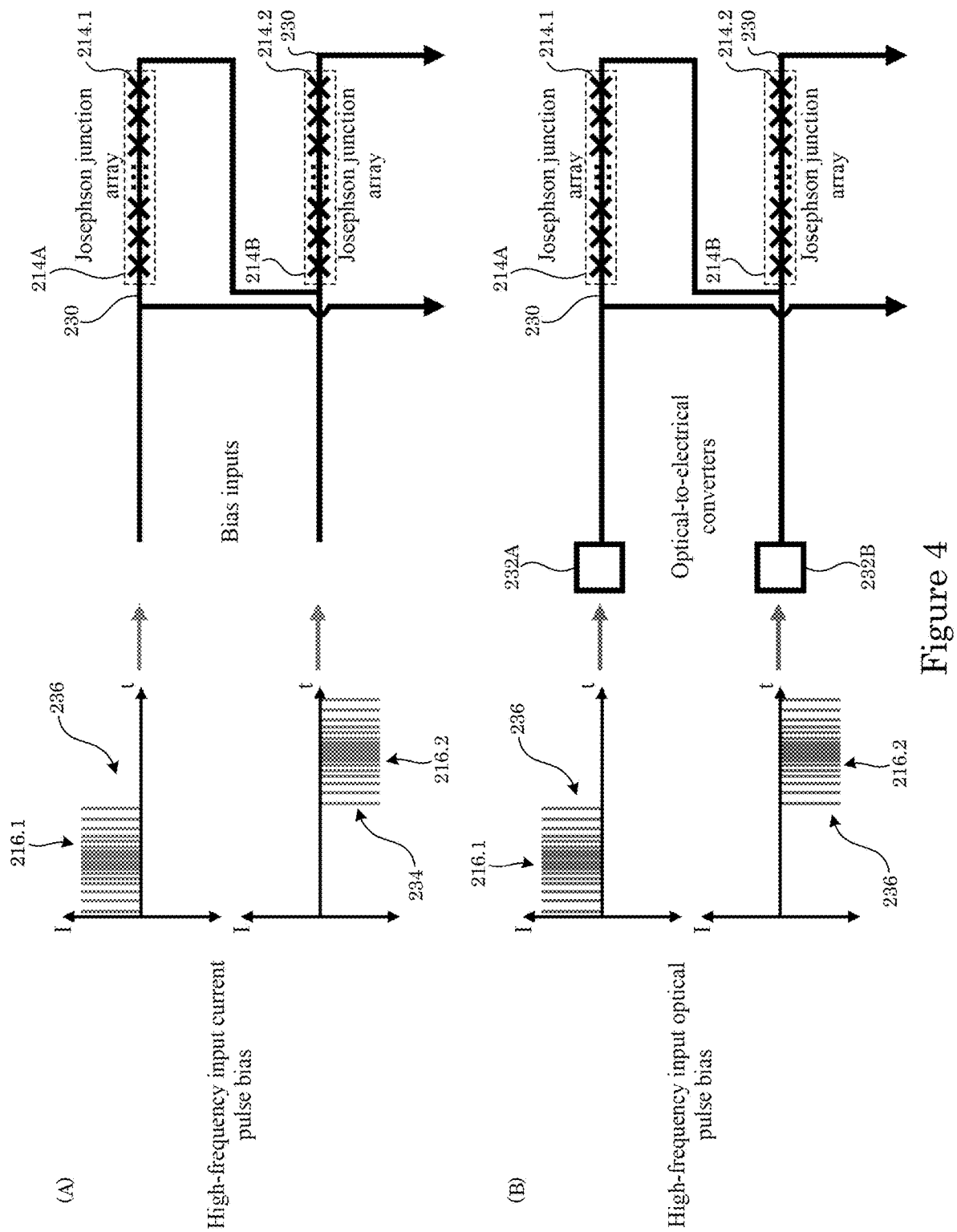
FIG. 4 shows production of an arbitrary waveform with a superconducting waveform synthesizer.
Figure 5:
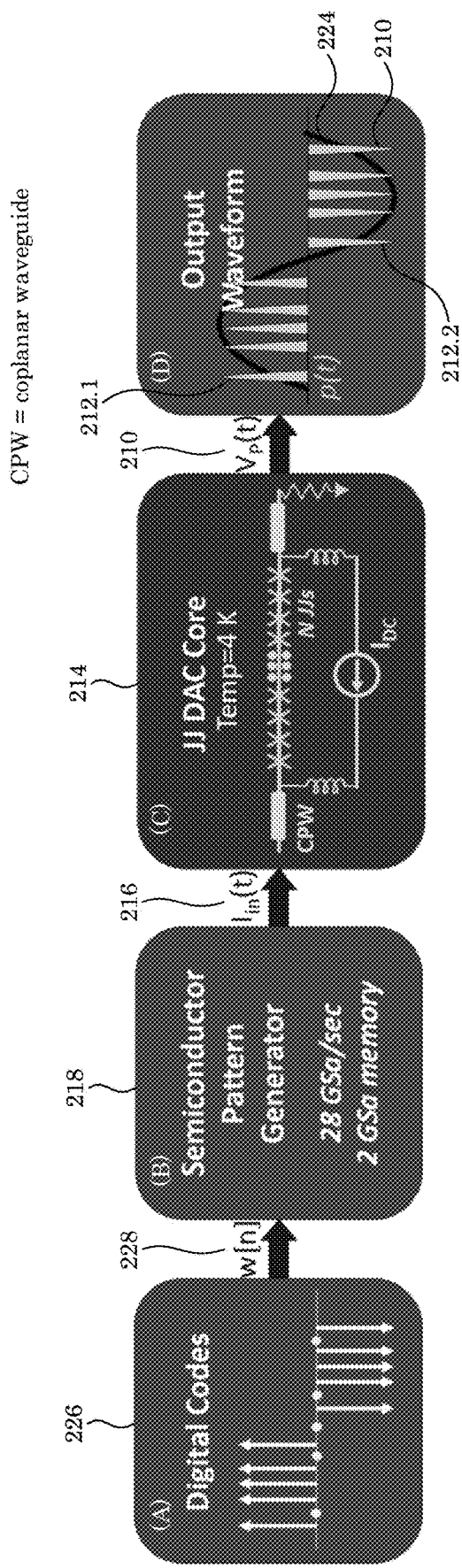
FIG. 5 shows a superconducting waveform synthesizer wherein panel (A) shows an input w[n] that is a three-level deltasigma encoding of a target output waveform. Panel (B) shows a pattern generator that synthesizes a series of three-level current pulses based on the programmed digital encoding. Panel (C) shows input current waveform Iin(t) that is transferred to a cryogenic superconducting JAWS chip that contains an array of JJs (symbolized by an "X") and that transforms the input current pulses to output voltage pulses with quantized area. Panel (D) shows output waveform Vp(t) that includes a train of JAWS-synthesized pulses, is measured at room temperature using a digitizer or spectrum analyzer, or is used as input to a device under test.

Pattern generator 218 receives bitstream 228 and produces current bias pulse 216 (e.g., 216.1, 216.2) from bitstream 228. Pattern generator 218 can include a multilevel output signal generator to output bitstream 228, memory for storing bitstream 228, a variable output sample rate, one or more output channels with filters for modifying the analog output, analog signal conditioning elements such as filters, diplexers, and attenuators, and the signal transmission path leading to the Josephson junction 214, including coaxial cables, Wilkinson power divider circuits, filters, or coplanar waveguide 230, to transform the bitstream 228 into current bias pulse 216 and can be a digital pattern generator, bitstream generator, arbitrary waveform generator, digital-to-analog converter (DAC), field-programmable gate array (FPGA), continuous wave signal generator and bitstream generator, single flux quantum circuit, superconducting digital circuit, or optical source and electro-optic converter. Moreover, pattern generator 218 can have multiple output channels, ability to modify or predistort the output with filters such as a finite impulse response (FIR) filter, have variable output amplitude and can include a signal amplifier, variable time rate for sampling bitstream 228, and a means to synchronize the sample output timing with other equipment. With reference to FIG. 4, pattern generator 218 can generate electrical pulses 234 directly or can generate optical pulses 236 that are transmitted by optical fiber and converted to electrical pulses 234 by electro-optic converter 232. Optical pulses 236 can be produced from an optical source such as a laser. For optical pulses 236, superconducting waveform synthesizer 200 can include electro-optic converter 232 that receives optical pulses 236 and converts optical pulses 236 into electrical pulses 234 to be used as current bias pulse 216. Electro-optic converter 232 can include an optical fiber input, optical element for electro-optic conversion and an electrical output to convert optical pulses 236 into electrical pulses 234 and can be a photodiode, photoconductive switch, or antenna. Moreover, electro-optic converter 232 can operate at room temperature or when cooled to cryogenic temperatures. A number of pattern generators 218 (e.g., 218.1, 218.2, . . . , 218.n, wherein n is an integer number of total pattern generators 218) can be from one to 1000, specifically from one to 10, and more specifically from one to four. In an embodiment, pattern generator 218 includes a multi-channel 8-bit semiconductor-based digital-to-analog converter with built-in FIR filters for each output channel to generate current bias pulse 216 with predistortion. In another embodiment, the envelope of a continuous wave laser or the optical pulses 236 generated by a pulse laser source are modulated or gated using an electro-optic modulator driven by a digital-to-analog converter that is relayed by optical fiber to electro-optic converter to create current bias pulse 216.

Current bias pulse 216 (e.g., 216.1, 216.2) can include an analog current signal with a multilevel pattern that encodes an arbitrary waveform such that the quantized output pulse 212 generated by Josephson junction 214 has the intended pulse pattern to represent arbitrary waveform 224 and can be a pattern of discrete pulses represented by impulse functions of one or more levels and one or both polarities, or a pattern that can include extra beneficial signals and features beyond the pulses that are implemented with filters or predistortion that do not cause Josephson junction 214 to generate quantized output pulse 212. Moreover, current bias pulse 216 can have a variable length that encodes a variable number of periods, or fraction thereof, of arbitrary waveform 224, and current bias pulse 216 can have different output levels that cause Josephson junction 214 to generate quantized output pulse 212 such that the quantization number varies over the pattern. A temporal pulse width of current bias pulses 216 independently can be as high as and can slightly exceed the characteristic frequency of Josephson junction 214, and so can be from 50 femtosecond (20 terahertz) to 1 nanosecond (1 gigahertz), specifically from 10 picoseconds (100 gigahertz) to 100 picoseconds (10 gigahertz), and more specifically from 20 picoseconds (50 gigahertz) to 70 picoseconds (14 gigahertz). A repetition frequency of current bias pulses 216 independently can be from 1 pulse-per-second to 20 terapulses-per-second, specifically from 10 gigapulses-per-second to 100 gigapulses-per-second, and more specifically from 10 gigapulses-per-second to 30 gigapulses-per-second. An amplitude of current bias pulses 216 independently can be from 0 ampere to 1 ampere, specifically from 5 milliampere to 50 milliampere, and more specifically from 5 milliampere to 25 milliampere. In an embodiment, primary current bias pulses 216 independently can be a positive-polarity current pulse or negative-polarity current pulse. As used herein, "positive-polarity" refers to a signal, such as a pulse, that extends in a positive direction from the baseline value of the signal. As used herein, "negative-polarity" refers to a signal, such as a pulse, that extends in a negative direction from the baseline value of the signal. A polarity of primary current bias pulse 216.1 and secondary current bias pulse 216.2 can be the same or different. According to an embodiment, primary current bias pulse 216.1 consists essentially of a positive-polarity current pulse, and secondary current bias pulse 216.2 consists essentially of a negative-polarity current pulse. In this manner, when primary current bias pulse 216.1 and secondary current bias pulse 216.2 are combined, arbitrary waveform 224 is bipolar. As used herein, "bipolar" refers to a signal, such as a pulse, that can extend in either the positive or negative direction from the baseline of the signal.

Figure 3:
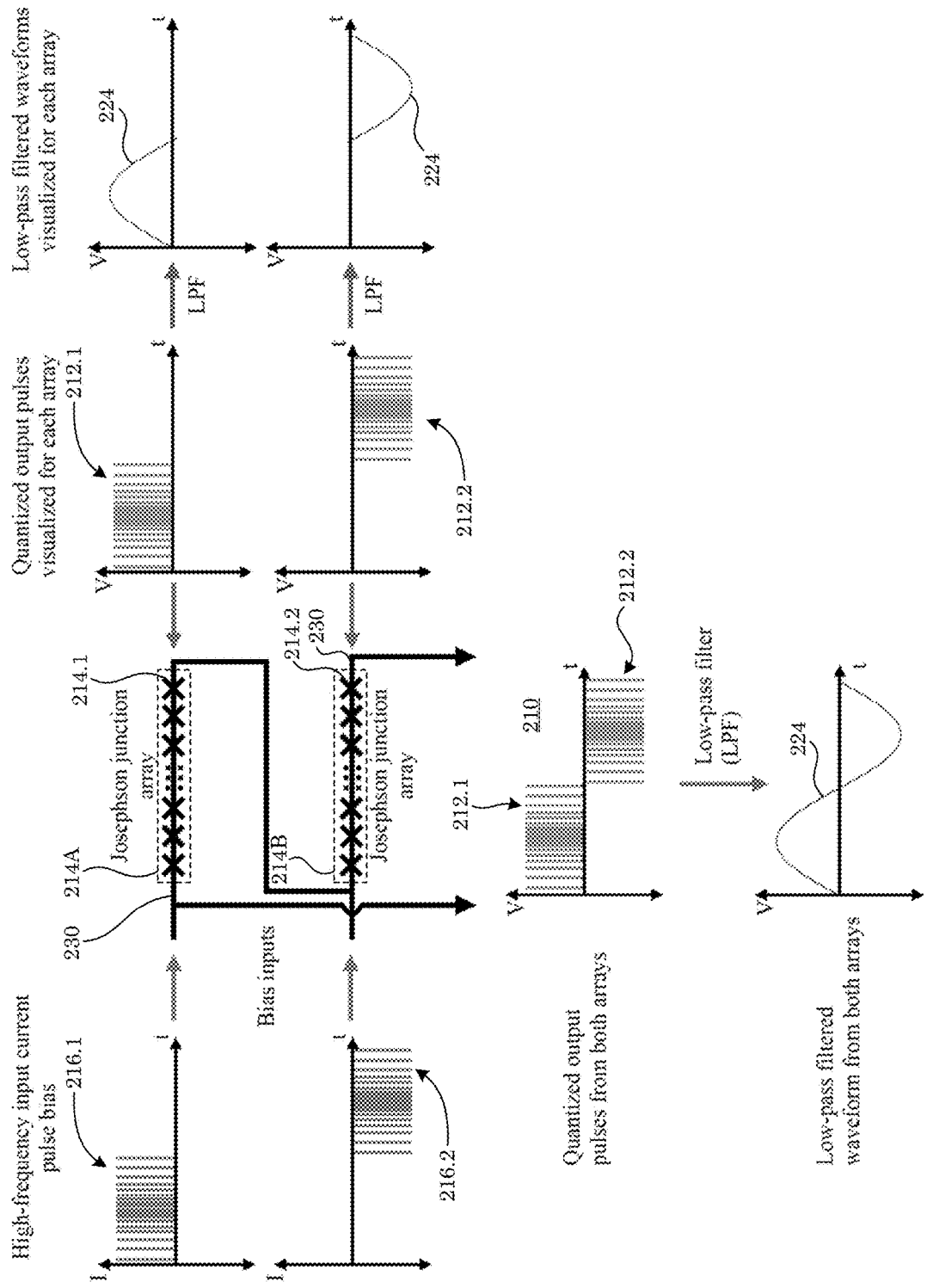
FIG. 3 shows production of an arbitrary waveform with a superconducting waveform synthesizer.

Josephson junction 214 (e.g., primary Josephson junction 214.1, secondary Josephson junction 214.2) receives current bias pulse 216 (e.g., primary current bias pulse 216.1, secondary current bias pulse 216.2) and produces quantized output pulse 212 (e.g., primary quantized output pulse 212.1, secondary quantized output pulse 212.2). Josephson junction 214 can include a pair of superconducting electrodes separated by a barrier of either normal metal, insulator, semiconductor, damaged superconductor, grain boundary or superconductor of different material or critical temperature to produce the quantized voltage pulses and can be of high-temperature (like $YBa_2Cu_3O_{7-x}$) or low-temperature (Nb) superconductor and barriers can be of $AlO_x$, $Nb_xSi_{1-x}$, AuPd, $Hf_xTi_{1-x}$ or $PBa_2Cu_3O_{7-x}$, or such junction having a shunting circuit in parallel with it, such as a normal resistance. Exemplary Josephson junction 214 includes Nb superconductor and non-insulating $Nb_xSi_{1-x}$ (x=15%) barrier. Moreover, at 4 K the junctions have electrical characteristics of superconducting critical currents of 7.2 mA and normal resistance of 4.5 mΩ. With reference to FIG. 3 and FIG. 4, Josephson junctions 214 can be arranged in a Josephson junction array (214A, 214B), wherein a plurality of Josephson junctions 214 are in serial electrical communication so that an output of a first Josephson junction adds to the output of a second Josephson junction in the array. In this manner, quantized output pulse 212 generated by Josephson junction array (214A, 214B) can be multiplied by a selected amount, e.g., as provided by the number of Josephson junctions 214 in Josephson junction array (214A, 214B). A number of Josephson junctions 214 (e.g., 214.1, 214.2, . . . , 214.n, wherein n is an integer number of total Josephson junctions 214) can be from one to one million, specifically from 2 to 20000, and more specifically from 12810 to 51240. In an embodiment, Josephson junction 214 includes a coplanar waveguide structure containing 1200 series-connected stacks of three junctions distributed in the center conductor of the coplanar waveguide.

Josephson junction array (214A, 214B) can include coplanar waveguide 230 in which Josephson junctions (214.1, 214.2) are disposed, e.g., as a center conductor. Further, Josephson junction array 214A and Josephson junction array 214B can be in serial electrical communication so that output of Josephson junction array 214A is electrically-connected to the input of Josephson junction array 214B so that the quantized output pulse 212.1 of Josephson junction array 214A adds to the quantized output pulse 212.2 of Josephson junction array 214B such that quantized pulse pattern 210 is "bipolar". Moreover, the timing of each current bias pulse 216.1 and 216.2 can be adjusted so that when quantized output pulse 212.1 combines with quantized output pulse 212.2 the phase coherence of arbitrary waveform 224 is maintained.

Quantized output pulse 212 (e.g., 212.1, 212.2) can include either "negative-polarity" or "positive-polarity" pulses or a combination of these, and of one or more quantization number, which are output by Josephson junction array 214 and can have the desired pulse pattern, or some portion of the desired pulse pattern, that encodes arbitrary waveform 224. A temporal pulse width of quantized output pulse 212 can be the width given by the characteristic frequency of the Josephson junction 214 and can be from 1 picosecond (1 terahertz) to 1 nanosecond (1 gigahertz), specifically from 10 picoseconds (100 gigahertz) to 100 picoseconds (10 gigahertz), and more specifically from 20 picoseconds (50 gigahertz) to 70 picoseconds (14 gigahertz). A repetition frequency of quantized output pulse 212 can match the frequency of current bias pulse 216 and can be from 1 pulse-per-second to 1 terapulses-per-second, specifically from 10 gigapulses-per-second to 100 gigapulses-per-second, and more specifically from 10 gigapulses-per-second to 30 gigapulses-per-second. A time-averaged area of quantized output pulse 212 can be from 0 volts to 10 volts, specifically from 1 millivolts to 4 volts, and more specifically from 1 millivolts to 2 volts. It is contemplated that Josephson junction 214 produces one or more quantized output pulse 212 per current bias pulse 216, and a voltage area of each quantized output pulse 212 is equal to nh/2e, wherein h is Planck's constant, e is an elementary charge of an electron, and n is the desired output quantization number, such that Josephson junction 214 operates in a quantum-locked condition and small variations in the operational or environmental conditions or the bias conditions, such as the current bias pulse 216, do not change the quantization of quantized output pulse 212.

Combiner 220 receives and combines primary quantized output pulse 212.1 and secondary quantized output pulse 212.2 to produce quantized pulse pattern 210. Combiner 220 can include a suitable way of electrically combining quantized output pulse 212.1 and quantized output pulse 212.2 to produce quantized pulse pattern 210 such as an electrical circuit for summing the two output signal lines, such as a tee circuit or Wilkinson combiner circuit, or coplanar waveguide 230 from the output of Josephson junction array 214A to the input of Josephson junction array 214B. Moreover, the timing of each current bias pulse 216.1 and 216.2 can be adjusted so that when quantized output pulse 212.1 combines with quantized output pulse 212.2 the phase coherence of arbitrary waveform 224 is maintained. In an embodiment, combiner 220 includes coplanar waveguide 230 that electrically connects the output of Josephson junction array 214A serially with the input of Josephson junction array 214B so that the quantized output pulse 212.1 of Josephson junction array 214A adds to the quantized output pulse 212.2 of Josephson junction array 214B such that quantized pulse pattern 210 can be "bipolar".

Quantized pulse pattern 210 can include either "negative-polarity" or "positive-polarity" pulses or a combination of these formed by combiner 220 that is composed from quantized output pulse 212.1 and quantized output pulse 212.2, and of one or more quantization number, which are output by primary Josephson junction 214.1 and secondary Josephson junction 214.2 and can have the desired pulse pattern, or some portion of the desired pulse pattern, that encodes arbitrary waveform 224. A temporal pulse width of quantized pulse pattern 210 can be the width given by the characteristic frequency of the primary Josephson junction 214.1 and secondary Josephson junction 214.2 and can be from 1 picosecond (1 terahertz) to 1 nanosecond (1 gigahertz), specifically from 10 picoseconds (100 gigahertz) to 100 picoseconds (10 gigahertz), and more specifically from 20 picoseconds (50 gigahertz) to 70 picoseconds (14 gigahertz). A repetition frequency of quantized pulse pattern 210 can match the frequency of primary current bias pulse 216.1 and secondary current bias pulse 216.2 and can be from 1 pulse-per-second to 1 terapulses-per-second, specifically from 10 gigapulses-per-second to 100 gigapulses-per-second, and more specifically from 10 gigapulses-per-second to 30 gigapulses-per-second. A time-averaged area of the pulses in quantized pulse pattern 210 can be from 0 volts to 10 volts, specifically from 1 millivolts to 4 volts, and more specifically from 1 millivolts to 2 volts. It is contemplated that primary Josephson junction 214.1 and secondary Josephson junction 214.2 produce one or more primary quantized output pulse 212.1 and one or more secondary quantized output pulse 212.2 per primary current bias pulse 216.1 and secondary current bias pulse 216.2, respectively, and a voltage area of each pulse in quantized pulse pattern 210 is equal to nh/2e, wherein h is Planck's constant, e is an elementary charge of an electron, and n is the desired output quantization number, such that primary Josephson junction 214.1 and secondary Josephson junction 214.2 operate in a quantum-locked condition and small variations in the operational or environmental conditions or the bias conditions, such as the primary current bias pulse 216.1 and secondary current bias pulse 216.2, do not change the quantization of quantized pulse pattern 210.

Converter 222 receives quantized pulse pattern 210 and converts quantized pulse pattern 210 to arbitrary waveform 224. Converter 222 can include an output signal line leading from Josephson junction array 214 and can include signal conditioning elements such as analog filters to extract the portion of quantized pulse pattern 210 that includes the desired arbitrary waveform 224 and filters, separates, or removes the undesirable components of the output signal, such as the signal relating to the current bias pulse 216 and any secondary signals it may generate. Exemplary converters 222 include diplexers, low-pass filters, high-pass filters, or band-pass filters. Moreover, converter 222 can be the output signal lines from the Josephson junction array 214 without additional signal condition elements. Converter 222 can also be realized as the output signal lines of a cryogenic probe station or can be another cryogenic device, such as a cryogenic analog-to-digital converter, or any other element used to measure, record or convey arbitrary waveform 224 produced from quantized pattern 210 by converter 222. In an embodiment, converter 222 includes the output coaxial or twisted-pair signal lines leading from the Josephson junction array 214 out to room temperature and additional analog low-pass filters that preserve and transmit the low-frequency signals in quantized pulse pattern 210 containing the desired arbitrary waveform 224, but low-pass filter and remove the undesired high-frequency signals generated by quantized pulse pattern 210 and current bias pulse 216. In another embodiment, converter 222 is realized with a cryogenic probe station using one or more signal paths that can include ground-signal-ground probes that can be positioned onto output pads of the Josephson junction array 214 using piezoelectric actuators, with output signals lines that can include coaxial cables that can lead to a network analyzer unit.

Arbitrary waveform 224 can include any analog voltage waveform or electrical signal waveform with alternating current (AC) and direct current (DC) components and can be a repeating waveform or can vary with time. Exemplary arbitrary waveforms 224 can include DC signals, single sinusoidal tones, multitone sinusoidal signals with specific relationships between individual tone amplitudes and phases, chirps, modulated signals, and complex signals that modulate over the complex plane. A temporal period of arbitrary waveform 224 can be from 1 picosecond to 1000 seconds, specifically from 10 picoseconds to 1 second, and more specifically from 100 picoseconds to 1 millisecond. A frequency of arbitrary waveform 224 can be from 1 to 1 terahertz, specifically from 1 hertz to 100 gigahertz, and more specifically from 1 kilohertz to 10 gigahertz. A root-mean-square amplitude of arbitrary waveform 224 can be from 0 volts to 100 volts, specifically from 1 millivolt to 10 volts, and more specifically from 1 volt to 4 volts. It is contemplated that arbitrary waveform 224 includes a combination of quantized pulse pattern 210, primary current bias pulse 216.1, or secondary current bias pulse 216.2.

Superconducting waveform synthesizer 200 can be made in various ways. In an embodiment, a process for making superconducting waveform synthesizer 200 includes disposing encoder 226 in communication with pattern generator 218 by using a computer with software containing a delta-sigma modulation algorithm to encode arbitrary waveform 224 in bitstream 228 using "bipolar" pulses, consisting of +1 and −1, and adding a zero-compensation filter to further transform each +1 and −1 pulse to −0.5, +1, −0.5 and +0.5, −1, +0.5 pattern blocks, and then uploading bitstream 228 to the memory of pattern generator 218; disposing encoder 226 in communication with Josephson junction 214 or Josephson junction array (214A or 214B) by connecting one or more output channels of pattern generator 218 to one radiofrequency amplifier per output channel using coaxial cable, then connecting each radiofrequency amplifier to sets of attenuators and high-pass filters to reduce the feedthrough error signal and connecting those filters and attenuators to the input coaxial assembly of a cryogenic cooling system, which leads to a connectorized, cryopackaged chip on which Josephson junction 214 has been fabricated, then using additional electrical leads connected to the cryopackaged chip to apply a bias offset current signal through Josephson junction 214 to measure and optimize the quantum locking range by adjusting such parameters as the output amplitude and FIR filter taps of pattern generator 218, and the output gain and eye-crossing adjustment of the radiofrequency amplifier; disposing Josephson junction 214 or Josephson junction array (214A or 214B) in communication with converter 222 by connecting filtering elements such as inductors and resistors on the cryopackaged chip containing Josephson junction 214 to form filters, such as a low-pass filter or diplexer circuit, to remove the undesired components of current bias pulse 216, including the high-frequency components of the bias pulses, and separate out and communicate only the components of the signal containing arbitrary waveform 224, with the low-pass filter taps connected to twisted-pair leads or coaxial lines leading from the cryopackaged chip at the cold stage of the cryocooler out to room temperature output connectors. The process can include, in a presence of Josephson junction array 214A and Josephson junction array 214B, disposing Josephson junction array 214A and Josephson junction array 214B in communication with combiner 220 by connecting an electrical tap on the output of Josephson junction array 214A to the input of Josephson junction array 214B and disposing combiner 220 in communication with converter 222 by connecting filtered electrical taps at the input of Josephson junction array 214A and the output of Josephson junction array 214B, and then connecting those electrical taps to communication channels, such as twisted-pair leads or radiofrequency coaxial cables, from the cryopackaged chip containing the arrays out to room temperature.

Superconducting waveform synthesizer 200 has numerous advantageous and unexpected benefits and uses. In an embodiment, a process for producing arbitrary waveform 224 with superconducting waveform synthesizer 200 includes: producing bitstream 228; producing primary current bias pulse 216.1 from bitstream 228; communicating primary current bias pulse 216.1 to primary Josephson junction 214.1; receiving, by primary Josephson junction 214.1, primary current bias pulse 216.1; producing, by primary Josephson junction 214.1, primary quantized output pulse 212.1 from primary current bias pulse 216.1; producing primary quantized output pulse 212.1 from primary current bias pulse 216.1; and producing arbitrary waveform 224 from primary quantized output pulse 212.1. The process for producing arbitrary waveform 224 also can included producing secondary current bias pulse 216.2 from bitstream 228; communicating secondary current bias pulse 216.2 to secondary Josephson junction 214.2; receiving, by secondary Josephson junction 214.2, secondary current bias pulse 216.2; and producing, by secondary Josephson junction 214.2, secondary quantized output pulse 212.2 from secondary current bias pulse 216.2. The process for producing arbitrary waveform 224 also can include combining primary quantized output pulse 212.1 and secondary quantized output pulse 212.2 to produce quantized pulse pattern 210; and converting quantized pulse pattern 210 to arbitrary waveform 224 to produce arbitrary waveform 224. The process for producing arbitrary waveform 224 also can include producing, by primary generator 218.1, primary current bias pulse 216.1; and producing, by secondary generator 218.2, secondary current bias pulse 216.2.

In the process for producing arbitrary waveform 224, producing bitstream 228 includes using a delta-sigma modulation implemented in software to encode arbitrary waveform 224 into a bipolar, three level pulse pattern consisting of −1, 0, and +1 pulses, that will be sampled using some desired output sampling rate of bitstream 228 by pattern generator 218. The delta-sigma modulation algorithm can be of the low-pass or bandpass forms, where the low-pass algorithm is generally used for arbitrary waveforms 224 with a fundamental frequency much lower than the sampling rate of bitstream 228 and the bandpass algorithm is generally used for arbitrary waveform 224 with a fundamental frequency that is large compared to the sampling rate of bitstream 228. Further, the three-level pulse pattern is further transformed into a five-level pattern by converting each [0, +1, 0] pattern block to [−0.5, +1, −0.5] and each [0, −1, 0] pattern block to [+0.5, −1, +0.5], thereby applying a high-pass zero-compensation filter to the pattern to reduce the signal amplitude of bitstream 228 at the fundamental frequency that can generate an undesired error signal in arbitrary waveform 224.

In the process for producing arbitrary waveform 224, producing primary current bias pulse 216.1 from bitstream 228 includes loading the portion of bitstream 228 containing the desired content to generate primary current bias pulse 216.1 into the memory of primary generator 218.1, which can include a high-speed digital-to-analog converter, and then adjusting the sampling rate of primary generator 218.1 to the designed sampling rate of bitstream 228, then turning on the output of primary generator 218.1 and adjusting its output amplitude and that of any additional radiofrequency amplifier to generate the desired current amplitude of primary current bias pulse 216.1, and then adjusting any FIR filter taps of primary generator 218.1 or associated hardware to optimize the properties of primary current bias pulse 216.1 in order to optimize the quantum locked range of arbitrary waveform 224. Additionally, the process includes synchronizing the output sampling of primary generator 218.1 to that of secondary generator 218.2 and adjusting the timing offset of the sampling from primary generator 218.1 with respect to secondary generator 218.2 so that primary current bias pulse 216.1 is phase coherent with respect to secondary current bias pulse 216.2.

In the process for producing arbitrary waveform 224, communicating primary current bias pulse 216.1 to primary Josephson junction 214.1 includes generating primary current bias pulse 216.1 using primary generator 218.1 and communicating that signal to a radiofrequency amplifier over coaxial cable, which in turn communicates the signal over coaxial cable to a set of attenuators and filters that are selected to minimize undesired errors in the generation of arbitrary waveform 224, such as feedthrough error signal. The signal is then communicated from the room temperature input of a cryocooler system down to the cold stage that includes primary Josephson junction 214.1 using coaxial cables, where a connector transitions the signal from the coaxial cable to coplanar waveguide on a circuit board on the cryopackaged chip, which abuts the chip containing primary Josephson junction 214.1 and is connected to it using wire bonds.

In the process for producing arbitrary waveform 224, receiving, by primary Josephson junction 214.1, primary current bias pulse 216.1 includes using additional filters, such as high-pass filters, to break the ground connection of, or AC couple, the input of Josephson junction array 214A or 214B to the input lines that communicate primary current bias pulse 216.1 to primary Josephson junction 214.1, so that one or more Josephson junction array 214A can be connected together electrically. Further, the input to primary Josephson junction 214.1 can include a power divider circuit, such as a Wilkinson divider, so that primary current bias pulse 216.1 can be divided between one or more Josephson junction arrays 214A to increase the number of arrays that can be biased by one output channel of primary generator 218.1. Further, the high-pass filter and Wilkinson divider circuits can be photolithographically fabricated on the same chip containing primary Josephson junction 214.1.

In the process for producing arbitrary waveform 224, producing, by primary Josephson junction 214.1, primary quantized output pulse 212.1 from primary current bias pulse 216.1 includes a process for measuring and optimizing the quantum locked range of the production of arbitrary waveform 224 to ensure that every primary Josephson junction 214.1 in Josephson junction array 214A generates an output pulse in primary quantized output pulse 212.1 with the required quantization number, n, for each input bias pulse in primary current bias pulse 216.1. The process is such that a current bias offset signal is applied to electrical taps connecting across Josephson junction array 214A so that an offset current bias signal can be added to primary current bias pulse 216.1 to determine the current range over which the total harmonic distortion of arbitrary waveform 224 is minimized and does not change with offset current bias.

In the process for producing arbitrary waveform 224, producing arbitrary waveform 224 from primary quantized output pulse 212.1 includes applying filters, such as low-pass filters, diplexers, or bandpass and bandstop filters, to separate the desired components at or near the fundamental synthesis frequency of arbitrary waveform 224 from the undesired components present in the measured output that can be generated by primary generator 218.1 and primary current bias pulse 216.1, including the high-frequency components of the pulses as well as the quantization error present in primary current bias pulse 216.1.

In the process for producing arbitrary waveform 224, producing secondary current bias pulse 216.2 from bitstream 228 includes loading the portion of bitstream 228 containing the desired content to generate primary current bias pulse 216.2 into the memory of secondary generator 218.2, which can include a high-speed digital-to-analog converter, and then adjusting the sampling rate of secondary generator 218.2 to the designed sampling rate of bitstream 228, then turning on the output of secondary generator 218.2 and adjusting its output amplitude and that of any additional radiofrequency amplifier to generate the desired current amplitude of secondary current bias pulse 216.2, and then adjusting any FIR filter taps of secondary generator 218.2 or associated hardware to optimize the properties of secondary current bias pulse 216.2 in order to optimize the quantum locked range of arbitrary waveform 224. Additionally, the process includes synchronizing the output sampling of secondary generator 218.2 to that of primary generator 218.1 and adjusting the timing offset of the sampling from secondary generator 218.2 with respect to primary generator 218.1 so that secondary current bias pulse 216.2 is phase coherent with respect to primary current bias pulse 216.1.

In the process for producing arbitrary waveform 224, communicating secondary current bias pulse 216.2 to secondary Josephson junction 214.2 includes generating secondary current bias pulse 216.2 using secondary generator 218.2 and communicating that signal to a radiofrequency amplifier over coaxial cable, which in turn communicates the signal over coaxial cable to a set of attenuators and filters that are selected to minimize undesired errors in the generation of arbitrary waveform 224, such as feedthrough error signal. The signal is then communicated from the room temperature input of a cryocooler system down to the cold stage that includes secondary Josephson junction 214.2 using coaxial cables, where a connector transitions the signal from the coaxial cable to coplanar waveguide on a circuit board on the cryopackaged chip, which abuts the chip containing secondary Josephson junction 214.2 and is connected to it using wire bonds.

In the process for producing arbitrary waveform 224, receiving, by secondary Josephson junction 214.2, secondary current bias pulse 216.2 includes using additional filters, such as high-pass filters, to break the ground connection of, or AC couple, the input of Josephson junction array 214B to the input lines that communicate secondary current bias pulse 216.2 to secondary Josephson junction 214.2, so that one or more Josephson junction array 214B can be connected together electrically. Further, the input to secondary Josephson junction 214.2 can include a power divider circuit, such as a Wilkinson divider, so that secondary current bias pulse 216.2 can be divided between one or more Josephson junction arrays 214B to increase the number of arrays that can be biased by one output channel of secondary generator 218.2. Further, the high-pass filter and Wilkinson divider circuits can be photolithographically fabricated on the same chip containing secondary Josephson junction 214.2.

In the process for producing arbitrary waveform 224, producing, by secondary Josephson junction 214.2, secondary quantized output pulse 212.2 from secondary current bias pulse 216.2 includes a process for measuring and optimizing the quantum locked range of the production of arbitrary waveform 224 to ensure that every secondary Josephson junction 214.2 in Josephson junction array 214B generates an output pulse in secondary quantized output pulse 212.2 with the required quantization number, n, for each input bias pulse in secondary current bias pulse 216.2. The process is such that a current bias offset signal is applied to electrical taps connecting across Josephson junction array 214B so that an offset current bias signal can be added to secondary current bias pulse 216.2 to determine the current range over which the total harmonic distortion of arbitrary waveform 224 is minimized and does not change with offset current bias.

In the process for producing arbitrary waveform 224, combining primary quantized output pulse 212.1 and secondary quantized output pulse 212.2 to produce quantized pulse pattern 210 includes using combiner 220 to electrically sum, using a device such as a tee circuit or Wilkinson combiner circuit or coplanar waveguide 230, primary quantized output pulse 212.1 and secondary quantized output pulse 212.2 so that the phase coherence of the portion of arbitrary waveform 224 each encodes is maintained.

In the process for producing arbitrary waveform 224, converting quantized pulse pattern 210 to arbitrary waveform 224 includes the implementation of a filter, such as a low-pass filter, diplexer, or bandpass and bandstop filter, to separate the component of quantized pulse pattern 210 containing arbitrary waveform 224 from the undesired components that include quantization error outside the signal band of interest and the high-frequency content of pulse pattern 210 and current bias pulse 216.

In the process for producing arbitrary waveform 224, producing, by primary generator 218.1, primary current bias pulse 216.1 includes separating out and loading the components of bitstream 228 responsible for producing the 'positive-polarity' portion of pulse pattern 210 into the memory of primary generator 218.1, and then using it to generate primary current bias pulse 216.1 synchronously and in proper phase adjustment with the production of secondary current bias pulse 216.2 by secondary generator 218.2.

In the process for producing arbitrary waveform 224, producing, by secondary generator 218.2, secondary current bias pulse 216.2 includes separating out and loading the components of bitstream 228 responsible for producing the 'negative-polarity' portion of pulse pattern 210 into the memory of secondary generator 218.2, and then using it to generate secondary current bias pulse 216.2 synchronously and in proper phase adjustment with the production of primary current bias pulse 216.1 by primary generator 218.1.

According to an embodiment, current bias pulse 216 is applied to Josephson junction 214 to create current bias pulse 216. A bipolar pulse bias pattern, e.g., bitstream 228, which initiates production of a selected quantized pulse pattern 210, is separated so that positive-polarity primary current bias pulses 216.1 are applied to first Josephson junction array 214A and negative-polarity secondary current bias pulses 216.2 are applied to second Josephson junction array 214B, e.g., as shown in FIG. 3. Current bias pulses (216.1, 216.2) can be communicated electrically to each Josephson junction array 214A, 214B to produce a selected unipolar quantized output pulse 212, e.g., using a high-speed pulse pattern generator, an arbitrary waveform generator, or like instrument, device, or circuit that induces a Josephson junction 214 or Josephson junction array (e.g., 214A or 214B) to produce quantized output pulses 212. Exemplary generators 218 and encoders 226 independently include single flux quantum circuits, optically-induced signals (e.g., from a pulsed laser driving electro-optic converter 232 or an antenna) that are converted into current bias pulses 216.

Superconducting waveform synthesizer 200 includes Josephson junctions that produce voltage pulses with quantized time-integrated area (of h/2e) and that are digitally controlled and timed with clocks, whose frequencies are referenced to atomic clock frequencies. Moreover, superconducting waveform synthesizer 200 is a quantum-accurate voltage source that can be used for calibration of ac voltage at frequencies up to a few megahertz for ac voltage calibration systems. Superconducting waveform synthesizer 200 extends a frequency range, signal purity, and accuracy as compared with conventional synthesized waveform to frequencies of tens or hundreds of gigahertz while operating Josephson junction 214 at an atomic clock frequency.

Superconducting waveform synthesizer 200 produces quantized pulse patterns using arrays of Josephson junctions that eliminates differential timing shifts of quantized pulses, which detrimentally affect timing of pulses in pulse patterns and patterns for waveform synthesis.

When bipolar output pulse patterns are created using a single Josephson junction or an array of junctions, any current flowing through the array causes positive and negative output pulses to shift in opposite directions in time (differential timing shifts). If these output pulses are used, for example, to encode a waveform, the differential timing shift leads to bias-current-dependent harmonic distortion (reduced signal purity) and inaccurate voltage amplitude of the intended synthesized tone. The magnitudes of currents flowing through an array, such as from leakage or loading currents, or more directly from amplitudes of the pulse bias or dither current bias, can vary but opposite polarity pulses from each junction are differentially shifted dependent upon the current magnitude. To eliminate differential pulse timing error in a presence of leakage or nonzero bias currents, superconducting waveform synthesizer 200 provides quantized output pulses 212 of each Josephson junction 214 to a single polarity so that a timing shift is identical for all pulses from each junction. Superconducting waveform synthesizer 200 can include a single junction producing a unipolar pulse pattern. Moreover, superconducting waveform synthesizer 200 eliminates polarity-dependent, pulse-shifting errors by combining arrays of one or more Josephson junctions such that each array provides output pulses of one polarity. Quantized output pulses 212 for Josephson junction array 214A and Josephson junction array 214A are combined or sampled to form a bipolar output pulse pattern for arbitrary waveform 224.

Beneficially, an overall time offset between positive and negative portions of bipolar quantized pulse pattern 210 due to a time delay from independent generator 218, circuit components, or differences in electrical properties of Josephson junction arrays (214.1, 214.2) is removed by adjustment of a relative timing of generators 218 that supply current bias pulses.

Moreover, superconducting waveform synthesizer 200 and processes herein have numerous advantageous properties. In an aspect, high voltage accuracy and low distortion are derived from the pulse quantizing behavior of the Josephson junction. Moreover, superconducting waveform synthesizer 200 and processes herein unexpectedly have signals that are more stable and reproducible than conventional apparatus because superconducting waveform synthesizer 200 is much less susceptible to timing jitter. Moreover, superconducting waveform synthesizer 200 provides a unique exploitation of the quantum effects of Josephson junctions and combines signals so that an output of superconducting waveform synthesizer 200 is an electrical signal that has higher accuracy, better reproducibility, and stability than conventional devices as a result of lower sensitivity to timing jitter.

The articles and processes herein are illustrated further by the following Example, which is non-limiting.

Example

Jitter Sensitivity Analysis of the Superconducting Josephson Arbitrary Waveform Synthesizer.

Jitter sensitivity analysis of a superconducting voltage reference waveform synthesizer with fundamentally accurate output pulses is described. Successful deployment of a reference waveform source at microwave frequencies represents a new paradigm for radio frequency metrology. The programmable waveform synthesizer described contains a 1.5-bit delta-sigma digital-to-analog converter (DAC) with a sampling frequency of 28 GHz. Quantified is the impact of random and deterministic output pulse position jitter (PPJ) on: 1) the amplitude accuracy of the output fundamental tone and 2) the in-band signal-to-noise and distortion ratio (SNDR). The superconducting DAC features a complete lack of output pulse width jitter, and random PPJ up to 200 fs rms has a negligible impact on accuracy and SNDR for synthesized tones up to 1 GHz. However, application of nonzero dc bias current is shown to produce deterministic PPJ of up to 5 ps, which, in turn, is shown to degrade the in-band SNDR by 30 dB at 1 GHz unless eliminated with techniques discussed in this paper. Verified is predicted effects of random and deterministic PPJ with simulations in the range of 100 kHz-1 GHz and with experiments in the range of 100 kHz-3 MHz.

The Josephson arbitrary waveform synthesizer (JAWS) is a superconducting digital-to-analog converter (DAC) used as the primary ac voltage standard in the audio-frequency spectrum. The JAWS system is assumed to be a perfect data converter, receiving a digital input pulse stream and outputting voltage pulses, each having a perfectly quantized and identical time-integrated area of exactly h/2e, where h is Planck's constant, and e is the electron charge. Efforts have begun at the National Institute of Standards and Technology (NIST) to experimentally demonstrate JAWS performance in the microwave-frequency range. JAWS waveform synthesis has recently been experimentally demonstrated at 100 MHz with plans to extend to over 1 GHz. Described is effects of output pulse timing jitter, as JAWS is extended to microwave frequencies.

The JAWS system is a superconducting circuit for synthesizing voltage reference waveforms. Another approach uses a zero-order-hold (ZOH) Nyquist-rate superconducting DAC with quantized voltage steps rather than quantized pulse areas. With this latter approach, jitter in the level transition timing is shown to degrade output accuracy for synthesis above several kilohertz. Here, simulated is the JAWS bias signals and device physics to identify mechanisms for pulse position jitter (PPJ) and to quantify the frequency-dependent effects of jitter on JAWS accuracy and spectral purity.

Jitter in conventional DACs is a limiting factor for achieving high spurious free dynamic range (SFDR) and signal-to-noise and distortion ratio (SNDR) and arises from sources such as sampling clock phase noise and intersymbol interference (IR). The deviation from ideal DAC output is often categorized into errors in pulse position or errors in pulse width.

When timing jitter is random and white, pulse width jitter (PWJ) has detrimental effect on in-band noise metrics because the noise contributed by PPJ is shaped to high frequencies that are typically out of band. For this reason, many designers of non-superconducting DAC architectures report extensive efforts to minimize PWJ, even at the expense of degraded linearity and increased circuit complexity. When jitter is deterministic, PPJ and PWJ both generate harmonics and spurious tones that degrade in-band noise and distortion metrics.

Due to the quantized nature of JAWS output pulse areas, the JAWS system features an intrinsic lack of PWJ in the output pulses; shown is that this leads to superior sensitivity to random timing jitter compared to conventional DAC architectures. However, identified and measured are a physical mechanism of the JAWS system that causes deterministic PPJ. Described is experimental findings of this deterministic PPJ that show corroboration between measured results and model calculations and simulations. Described is methods to eliminate deterministic PPJ so as to preserve spectral purity for programmable synthesized microwave frequencies.

A schematic of the JAWS circuit is shown in FIG. 1. The JAWS DAC converts three-level (1.5 bit) digital encodings of target waveforms into three-level output streams of pulses with quantized area, such that the positive and negative pulses plus the zero-pulse condition produce synthesized waveforms of bipolar amplitude. First [see FIG. 1 (Box 1)], an arbitrary waveform is encoded into a three-level (−1, 0, +1) bitstream, here called w[n]. Used is a low-pass or bandpass deltasigma encoding algorithm to move the quantization noise out of band. The bitstream w[n] is stored in the memory of a room-temperature pattern generator. The JAWS system can also be operated as a 1-bit DAC with a two-level (unipolar) w[n] sequence.

At operation, the pattern generator converts w[n] to an input current waveform Iin[see FIG. 1 (Box 2)]. For the experiments described, used is an arbitrary waveform generator with a clock rate of 28 GHz and an analog bandwidth of 25 GHz.

The waveform tin is transferred, via coaxial cables embedded in a cryogenic probe, to the superconducting JAWS chip that resides at a temperature of ~4 K in liquid helium [see FIG. 1 (Box 3)]. The JAWS chip, which serves as the DAC core, contains a series-connected array of superconducting circuit elements known as Josephson junctions (JJs). The JJs are embedded in the center conductor of a coplanar waveguide. The current Iin provides the microwave-frequency input excitation, while Idc is a tunable dc offset current. Most implementations of the JAWS system include additional digital code prefiltering and on-chip analog filtering to isolate the measured output waveform from the input drive; the details of the circuit design and pulse drive are described elsewhere.

In response to the input multibit bias signal, the JJs create the waveform Vp(t) by producing output pulses that match the encoded polarity of the digital bitstream [see FIG. 1 (Box 4)]. For a specific range of input parameters, the DAC core operates in quantum-locked conditions, in which there is one output pulse per JJ per input pulse, and the voltage area of each output pulse is equal to h/2e. The area of every quantized pulse is completely invariant with respect to Iin, Idc, or any other environmental or experimental variables. Experimental measurements and analyses presented have JAWS device operating in quantum-locked conditions. This quantum-locked behavior produces the voltage accuracy and waveform purity of the JAWS device output signals. It distinguishes the JAWS DAC from all other DACs.

In the absence of jitter, the DAC output waveform Vp(t) is described by the convolution of the output pulse P(t) from the full JJ array with the input digital bitstream $$Vp(t)=P(t)\otimes \Sigma nw[n]\delta(t-nT) \quad (1)$$

where the symbol ⊗ refers to convolution, T is the sampling period defined by the pattern generator, t refers to time, and n is the bit index of the input bitstream w[n].

Figure 6:
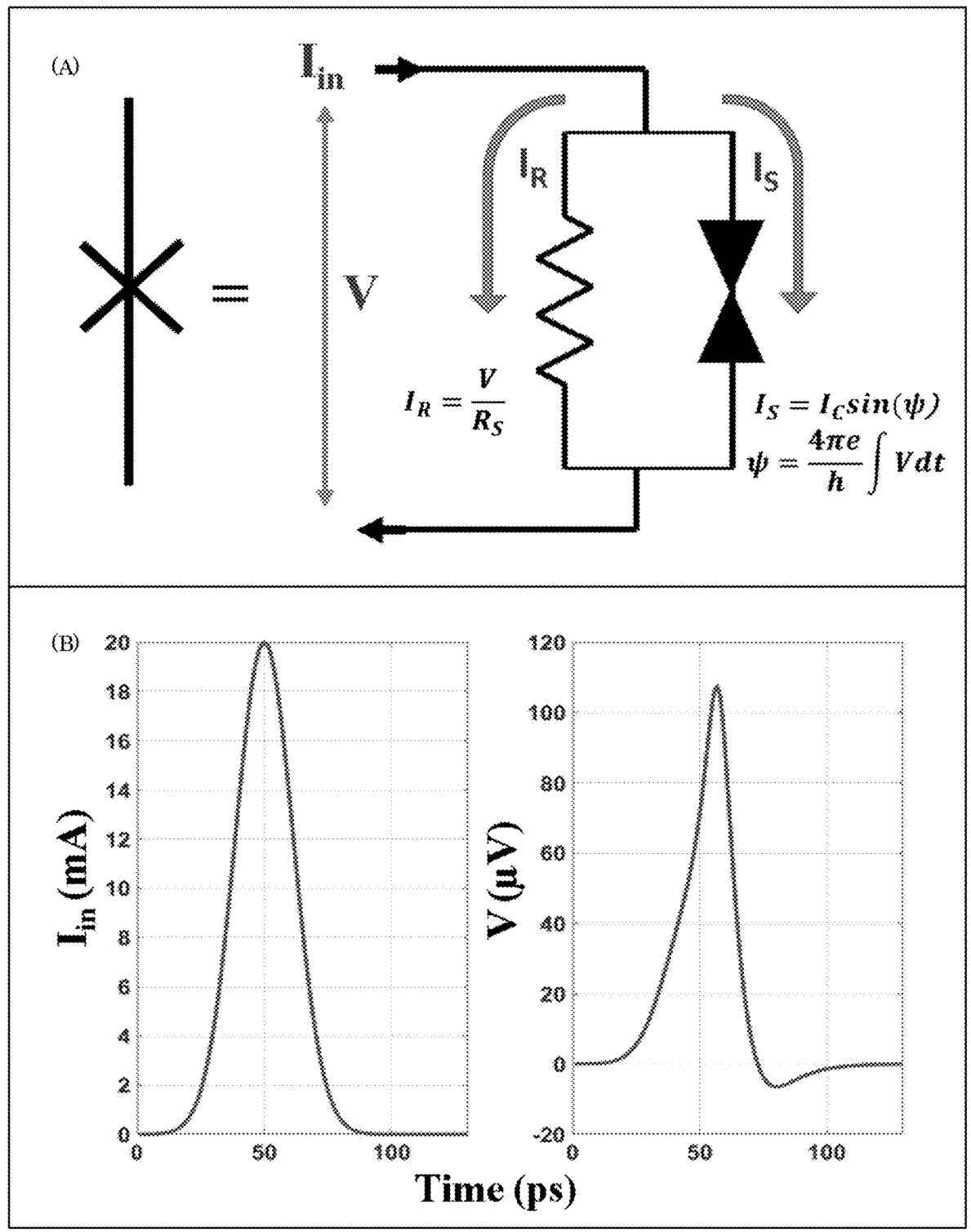
FIG. 6 shows (a) an RSJ model of a JJ: the device (symbolized by an "X") is modeled as a resistor (Rs) in parallel with a superconducting current branch. (b) Output voltage pulse waveform (right) from a single JJ in response to an input current pulse (left). The time integral of V(t) is exactly h/2e.

With regard to DAC core and Josephson junctions, JJs in the JAWS DAC core each include two niobium superconducting electrodes, separated by a thin barrier of nonsuperconducting material. The junctions have a noninsulating NbxSii-x junction barrier. These JJs have negligible capacitance and are described by the resistively shunted junction (RSJ) model. The RSJ model is shown in FIG. 6(a). In this model, input excitation current splits between a resistive current branch and supercurrent branch. The supercurrent branch can pass a maximum dc current of Ic, known as the critical current. The resistance (Rs) and Ic are adjustable by the selection of barrier and superconductive electrode materials and by fabrication parameters, such as barrier thickness, niobium concentration, and junction area. The JJs used are modeled with Rs=4.5 mΩ and Ic=7.2 mA, which are the mean values of the experimentally measured JJs in the arrays. The characteristic pulse time of the JJs decreases with increasing IcRs product.

The currentvoltage characteristics of the JJs are given by the Josephson equations $$Is=\psi=Ic\,\sin(\psi)4\pi eh\!\int Vdt \quad (2)(3)$$

where Is is the current through the supercurrent branch and ψ is the junction phase. An external dc input current below Ic is fully shunted by the supercurrent branch, while a time-varying input or an input greater than Ic forces a time-varying potential difference V(t) across the junction.

When a JJ is in the quantum-locked conditions, a transient driving current pulse causes the junction phase (proportional to integrated voltage) to change by 2π, as current through the superconducting branch evolves through one period of Idc=Icsin(ψ)→Idc=Icsin(ψ+2π). The 2π a change in the junction phase corresponds to an integrated voltage pulse area of ∫Vdt=h/2e. This is known as a single flux quantum (SFQ) pulse. Examples of an input current drive pulse and an output SFQ pulse are shown in FIG. 6(b).

Because the quantized pulse area given by a single junction is small, the JAWS system uses a series array of N nominally identical JJs, so that the area of the output response is Nh/2e for each input pulse to the array. Single-tone waveforms with rms amplitude up to 2 V have been demonstrated at 1 kHz, using 102,400 JJs in series.

For the simulation of JJ dynamics and interactions with other circuit elements, we use a version of SPICE that implements the RSJ JJ model.

With regard to system metrics, the JAWS system is used in a variety of applications, including calibration of rms power within a specified bandwidth, calibration of single-tone and multitone amplitudes, and characterization of nonlinear effects in transmitter and receiver chains and measurement electronics. In particular, the perfect linearity of the programmable output amplitudes is a unique feature of the JAWS system, as is the ability to synthesize multitone signals with stable, repeatable amplitudes and arbitrary ratios. Single-tone waveforms are considered and used is two metrics to quantify accuracy and spectral purity of these tones.

With regard to fundamental tone accuracy, the amplitude accuracy of the fundamental tone is defined as any deviation of the output fundamental amplitude from the value programmed in w[n]. Conventional radio frequency (RF) calibration services based on thermal converters offer an uncertainty of 100 μV/V-1000 μV/V at 1 MHz, and thermistor-referenced power calibrations have a flat uncertainty metric of 2000 μV/V for 10 MHz-1 GHz. JAWS system can outperform these metrics. The JAWS system also offers the advantage of spectral selectivity, whereas thermistor-based systems can only integrate the total output power from an RF source.

With regard to SNDR, SNDR is the ratio of signal power to total noise and distortion power within a ±5 MHz bandwidth of the fundamental tone f0, expressed in decibel units. Simulations of bandpass deltasigma encodings use a bandwidth of 10 MHz. For f0<5 MHz, integrated is noise power from dc to 10 MHz to calculate SNDR.

Deltasigma waveform encodings are used that have in-band signal-to-quantization-noise ratio (SQNR) of at least 80 dB. Noise and distortion contributed by jitter remains below the quantization noise level.

With regard to deterministic pulse position jitter as a source of deterministic PPJ for nonzero DC current, a source of deterministic jitter considered is polarity-dependent shift in the output pulse timing due to a nonzero Idc through the JJ array. When Idc=0, each input pulse causes a phase winding of each JJ, from $\psi=2\pi x \to \psi=2\pi(x+1)$. However, if Id≠0, the JJ phase will instead proceed from $2\pi x+\psi 0 \to 2\pi(x+1)+\psi 0$. According to the dc Josephson equation, $\psi 0=\sin^{-1}(Idc/IC)$.

Figure 7:
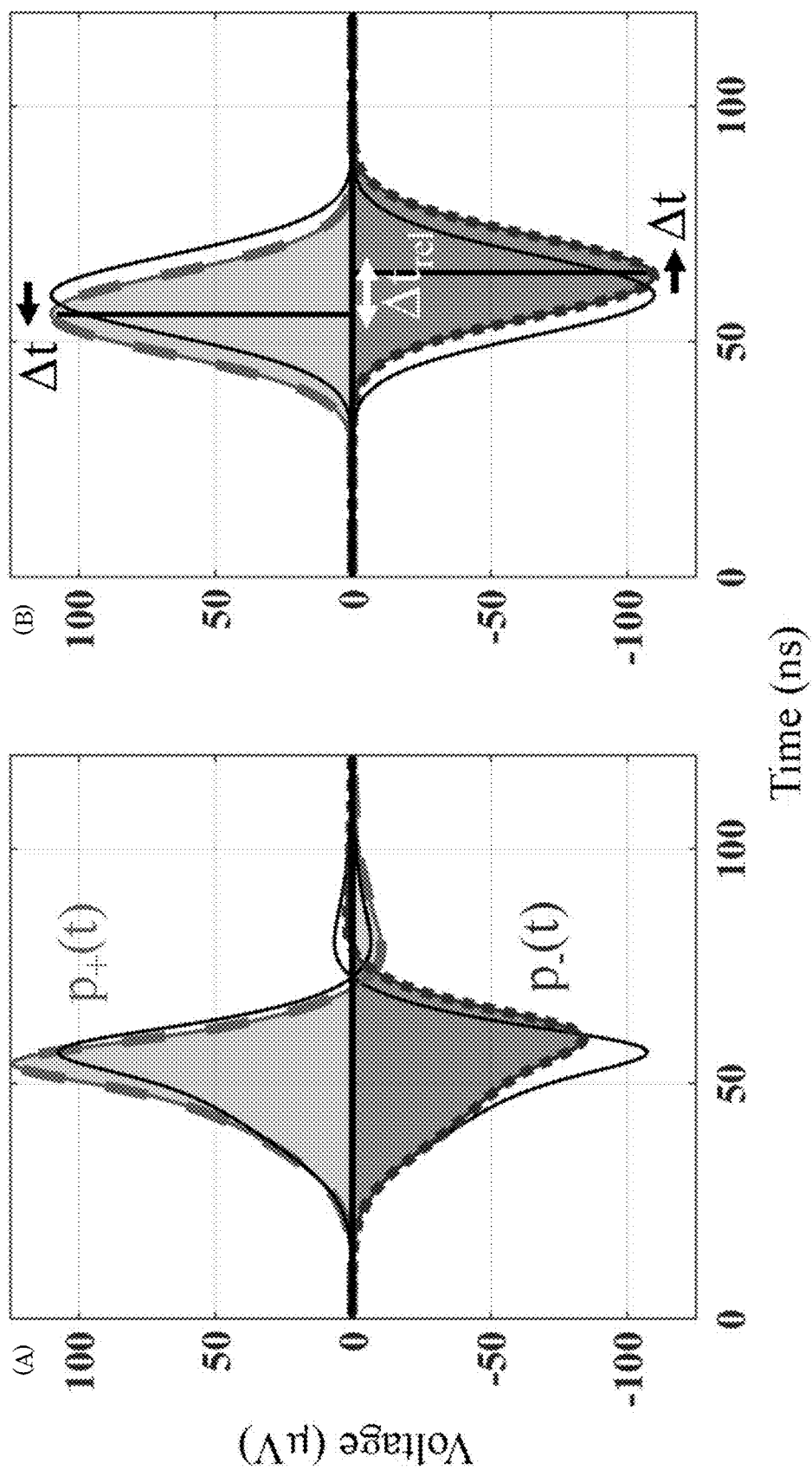
FIG. 7 shows a graph of voltage versus time, wherein panel (A) includes voltage-time traces of positive (long grey dashes) and negative (short dark dashes) SFQ pulses with positive applied bias, Idc, based on a SPICE model of a single JJ with Ic=7.2 mA and Rs=4.5 mΩ. The shaded area of each pulse is h/2e. (B) Simplified PPJ model for the difference between p+(t) and p(t). Differences between pulse shapes due to Id≠0 are neglected. In both panels, the thin black solid curves show the shapes of positive and negative pulses when Idc=0.

Within a quantum locking range, a constant offset $\psi 0$ does not affect the quantized SFQ pulse area. It was, therefore, previously assumed that the output waveform variation with respect to Idc should be identically zero. However, we have recently experimentally observed Idc-dependent harmonic generation, which indicates that while variations in Idc do not affect the SFQ pulse area, they do lead to deterministic, polarity-dependent jitter in the SFQ pulse position. SPICE simulations of positive and negative SFQ pulse waveforms from a single JJ (p+(t) and p−(t)) with a positive Idc are shown in FIG. 7(a). The symmetry between positive and negative pulse waveforms is broken when Id≠0.

Differences between the shapes of p+(t) and p−(t) observed in FIG. 7(a) are neglected in our model of PPJ. The simplified PPJ model uses a fixed relative time shift between opposite polarity pulses and ignores Idc-dependent differences in pulse shape, as shown in FIG. 7(b).

Relative time shift Δtrel is determined by the relative phase delay between pulses, $\Delta trel=(\Delta\phi(f)/2\pi f)$, where $\Delta\phi(f)$ is the phase shift between the Fourier components of p+(t) and p−(t) at frequency f. The pulses shown in the model of FIG. 7(b) have constant relative phase delay at all frequencies. The actual JJ pulses shown in FIG. 7(a) have frequency-dependent phase delay above 1 GHz. As shown in Section III-C, the PPJ model becomes inaccurate above 1 GHz, because it does not include this dispersion effect.

Figure 8:
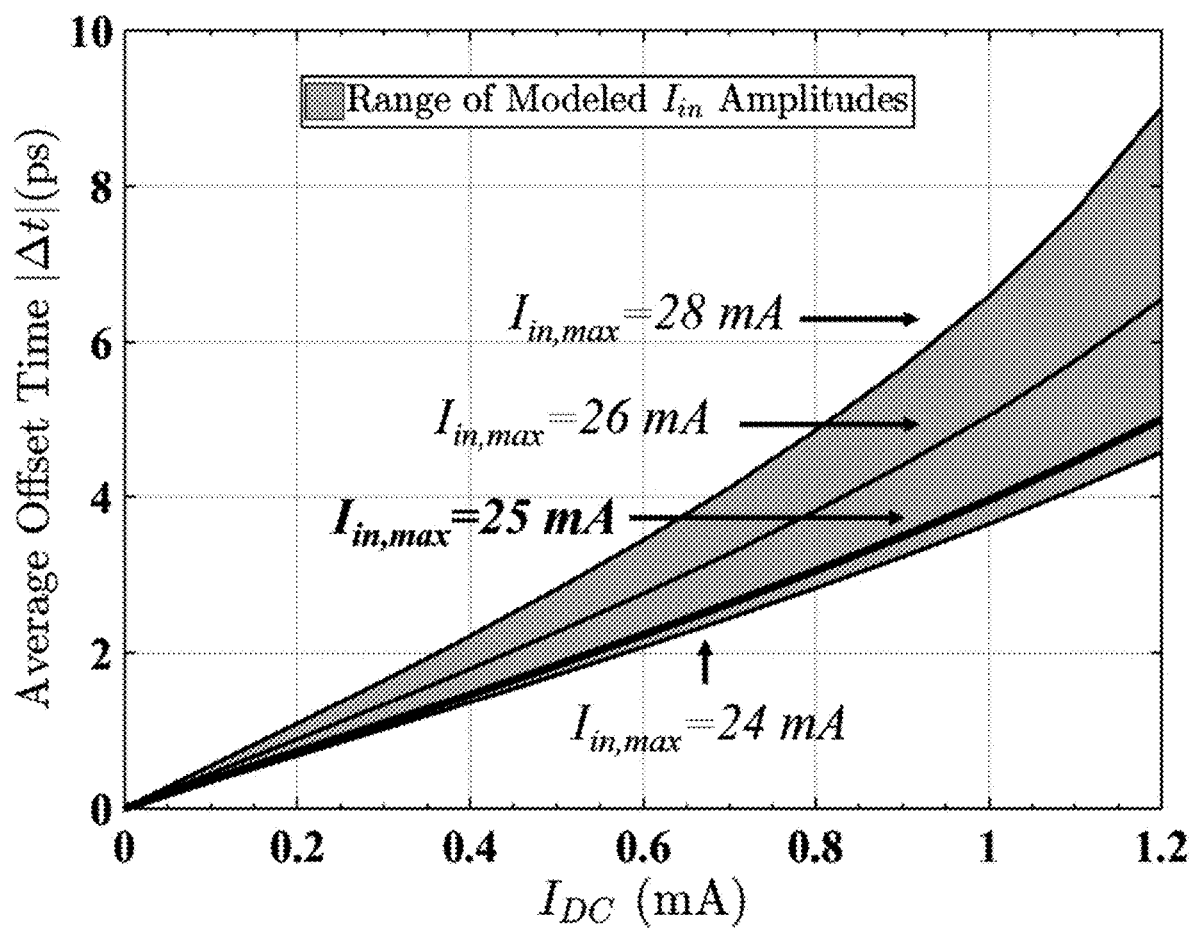
FIG. 8 shows a graph of average offset time versus Inc for different Iin,max microwave amplitudes. The curve used for SPICE simulations is indicated with a thick black line.

For the PPJ model, define $\Delta t=\pm\Delta trel/2$, which is an advance or delay of a positive or negative pulse when Id≠0 relative to its position when Idc=0. In FIG. 8, |Δt| is plotted as a function of Idc based on SPICE simulations of the JJs. In general, a pulse with polarity that matches the polarity of Idc will experience a slight advance in time (Δt<0), and a pulse with opposite polarity to Idc will be delayed (Δt>0). The value of Δt is also sensitive to the input pulse amplitude Iin, which is tuned in experiments to maximize the quantum locking range. The Δt—versus—Idc curves for several Iin values are shown in FIG. 8. The curve corresponding to Iin pulse amplitude of 25 mA was used for modeling. The JAWS system fails to remain quantum locked at |Idc|≳1.2 mA. The value of Δt grows nonlinearly with Idc near this failure condition, as the SFQ pulse shapes become increasingly distorted relative to their shape at Id≠0.

With regard to other sources of deterministic PPJ, at a chip level, nonzero Idc is expected to be the dominant source of jitter that causes deterministic pulse timing errors. However, the room-temperature input pulse drive electronics are another potential source of deterministic PPJ. For example, deviations from the ideal 50% eye crossing percentage in the input RF amplifier will cause polarity-dependent asymmetry in the input pulse drive. Similar to nonzero Idc, this would cause timing offsets between positive and negative output pulses. The eye crossing level of the amplifier is tuned to maximize the quantum locking range prior to JAWS operation.

Used is a return-to-zero scheme for the input pulse drive to minimize ISI, which may cause code-density-dependent timing differences in output pulses. However, some ISI may still result in high-amplitude, high-pulse-density input codes. ISI could also arise from attenuation and dispersion of the input pulse drive caused by the input cabling.

In an experimental measurement up to 3 MHz, nonzero Idc is the source of deterministic PPJ to cause observable deviation between the programmed and the expected output spectrum.

With regard to a theoretical effect of deterministic PPJ, used is a deterministic PPJ model to simulate trends in amplitude accuracy and SNDR. According to the deterministic PPJ model, the output waveform from the JAWS system can be expressed as the convolution of the JJ array pulse waveform with the time-shifted digital input encoding $$Vp,jit(t)=P(t)\otimes \Sigma nw[n]\delta(t-nT+\Delta t(Idc)w[n]) \quad (4)$$

where the magnitude of the time shift Δt(Idc) is chosen according to the indicated mapping in FIG. 8, and the polarity depends on the polarity of the pulse, encoded in w[n]. Simulations of (4) can be performed quickly and do not require analog circuit modeling, because all changes in the output pulses are transferred to time shifts in the input digital code.

To the first order, deterministic polarity-dependent PPJ as defined in (4) causes mixing of the spectrum of the jitter-free waveform Vp(t) with itself. The spectral content of Vp(t) includes both the fundamental tone f0 and the digital encoding quantization noise. Mixing generates spurious content at all possible sum and difference frequencies; these deterministic spurs cannot be reduced by longer data acquisition times or averaging. The spurious content results in a loss in amplitude of the programmed tone, thus compromising the expected JAWS voltage accuracy.

The effect of deterministic, polarity-dependent PPJ on the original complex magnitude am of a tone at frequency fm in the jitter-free output spectrum is overall expressed as $$am \to \text{-jitter}(1-\alpha(fm))am \pm \Delta a,m. \quad (5)$$

The first term (1−α(fm))am is a fractional decrease in amplitude, and dominates at the fundamental tone f0, and leads to indeterminate deviation from the programmed output value. The second term Δa,m is the net result of all quantization noise mixing that generates spurious content at fm and is dominant in magnitude for frequencies fm≠f0 within the deltasigma encoding low-noise bandwidth.

With regard to amplitude loss due to deterministic PPJ, a fractional loss in the amplitude of the fundamental tone f0 due to deterministic, polarity-dependent PPJ is approximately equal to (see the Appendix)

$$\alpha(f0)=1-\Pi fm(J0(am2\pi\Delta tf0)) \quad (6)$$

where J0(x) is the Bessel function of the first kind, and the product is taken over all frequency components fm in the ideal output Vp(t). The loss in amplitude grows with f0, because J0(x) decreases below one as its input argument grows.

Figure 9:
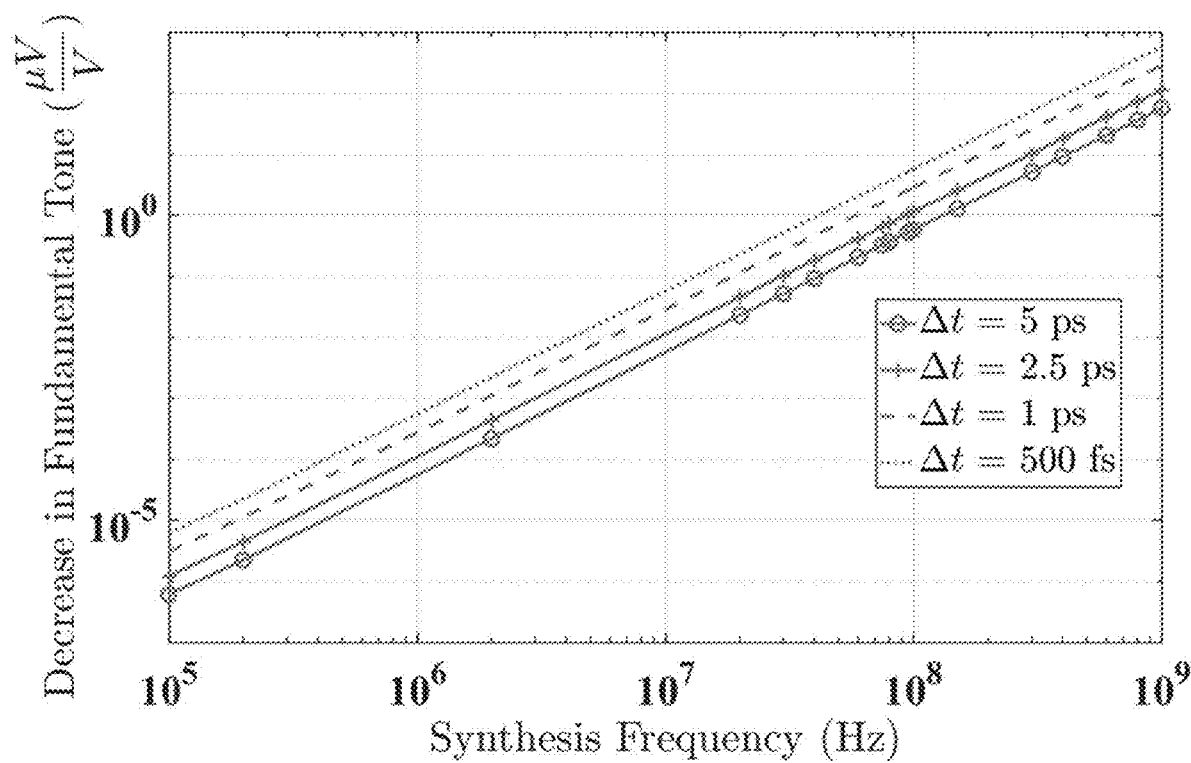
FIG. 9 shows a graph of decrease in an amplitude of the fundamental tone f0 versus synthesis frequency for various deterministic jitter pulse offset times.

In FIG. 9, the simulated loss in the amplitude of the fundamental tone f0 versus frequency is shown for a range of pulse offset times Δt. While this loss is calculable for a known Δt, the experimentally observable parameter is Idc and not Δt. Any uncertainty in Idc or the Idc—versus—Δt relationship will thus lead to uncertainty in the output amplitude of the JAWS system. However, even at 1 GHz, FIG. 9 shows that the loss in amplitude is <1000 μV/V, and JAWS remains competitive with existing thermistor-referenced ac standards over the expected range of Idc.

With regard to loss in SNDR due to deterministic PPJ, deterministic jitter degrades the SNDR metric when the average magnitude of Δa,m within the deltasigma encoding low-noise bandwidth exceeds the average baseline quantization noise magnitude. The trend in Δa,m is on average linear with both frequency fm and pulse time offset Δt.

Figure 10:
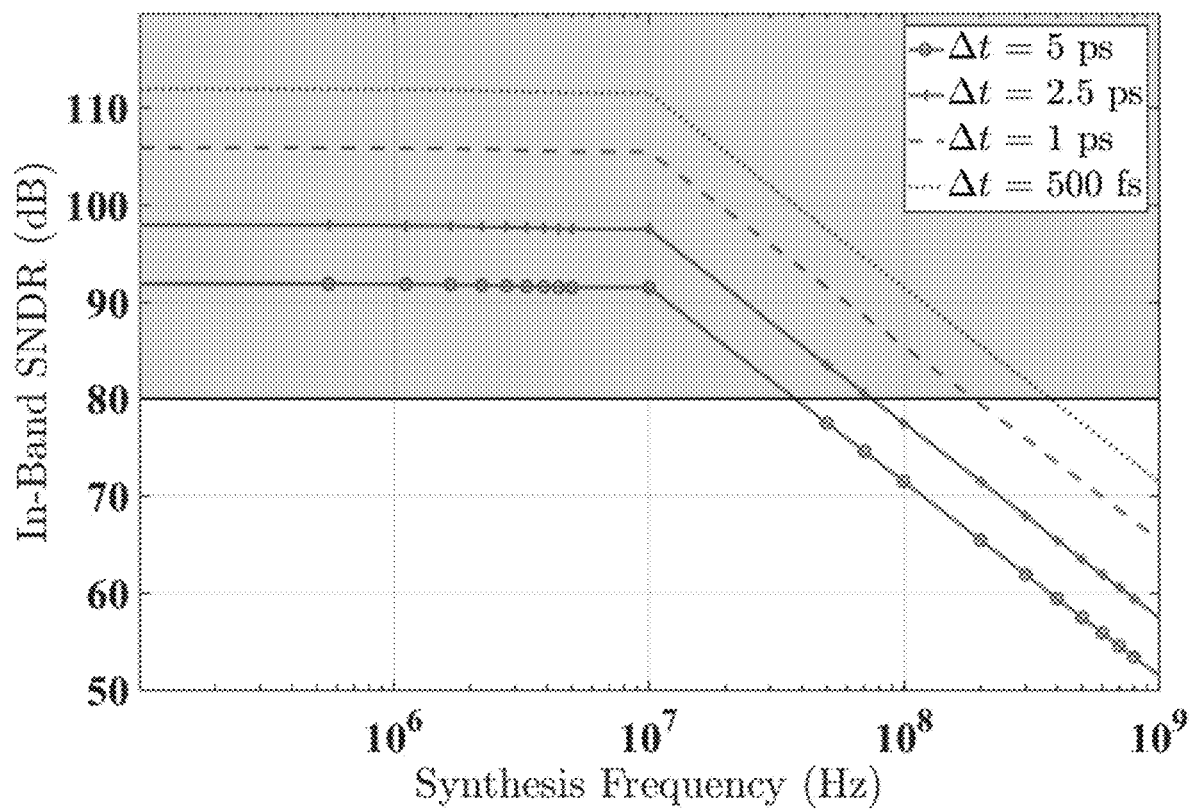
FIG. 10 shows a graph of in-band SNDR versus synthesis frequency for deterministic pulse jitter times of Δt=500 fs, 1 ps, 2.5 ps, and 5 ps. Baseline SQNR of 80 dB at Idc=0 is also shown. A 1.5-bit delta sigma code and 28 GHz clock frequency were used. Below 5 MHz, SNDR is constant.

The simulated scaling of SNDR with frequency for an eighth-order bandpass encoding algorithm of total length 5 million samples (MSa) is shown in FIG. 10, at multiple values of Δt. The SNDR shown is the ratio of signal to jitter noise only, after subtracting out quantization noise. The minimum target SQNR of 80 dB is indicated. The scaling of jitter-contributed SNDR with frequency is constant below f0=5 MHz due to our definition of a 10 MHz noise bandwidth.

With regard to generation of the second harmonic, because polarity-dependent PPJ causes mixing of the spectrum of Vp(t) with itself, a strong second harmonic signal is generated at 2f0 when Vp(t) is a single-tone waveform. This will degrade SFDR for f0<5 MHz, when 2f0 is within the deltasigma code bandwidth.

Simulations with two-tone (f1 and f2) deltasigma codes with Id≠0 show that the in-band third-order mixing product (e.g., at 2f1−f2) is small in amplitude compared to the second-order mixing products, and not expected to further degrade in-band noise and distortion metrics.

With regard to JAWS analog circuit simulations, SPICE simulations are used to verify that the deterministic PPJ model of (4) is accurate up to 1 GHz and to quantify inaccuracies of this model at higher frequencies.

A generic formulation for the effect of deterministic jitter that allows the pulse waveform to vary with each input bit can be written as $$Vp,jit(t)=\Sigma nPn(t)\otimes w[n]\delta(t-nT). \quad (7)$$

This model, in which the output pulses depend on the code index n, is best implemented with full circuit simulations. In these simulations, we excite an array of 100 JJs with an input current waveform tin that is generated based on a 1.5-bit bandpass deltasigma encoding clocked at 28 GHz and is prefiltered based on the scheme described in. Calculated is the in-band SNDR of the resulting output waveform when Id≠0. In the simulations, Idc=500 μA. In the simplified model of (4), Δt≈0.8 ps, wherein Idc=500 μA.

Figure 11:
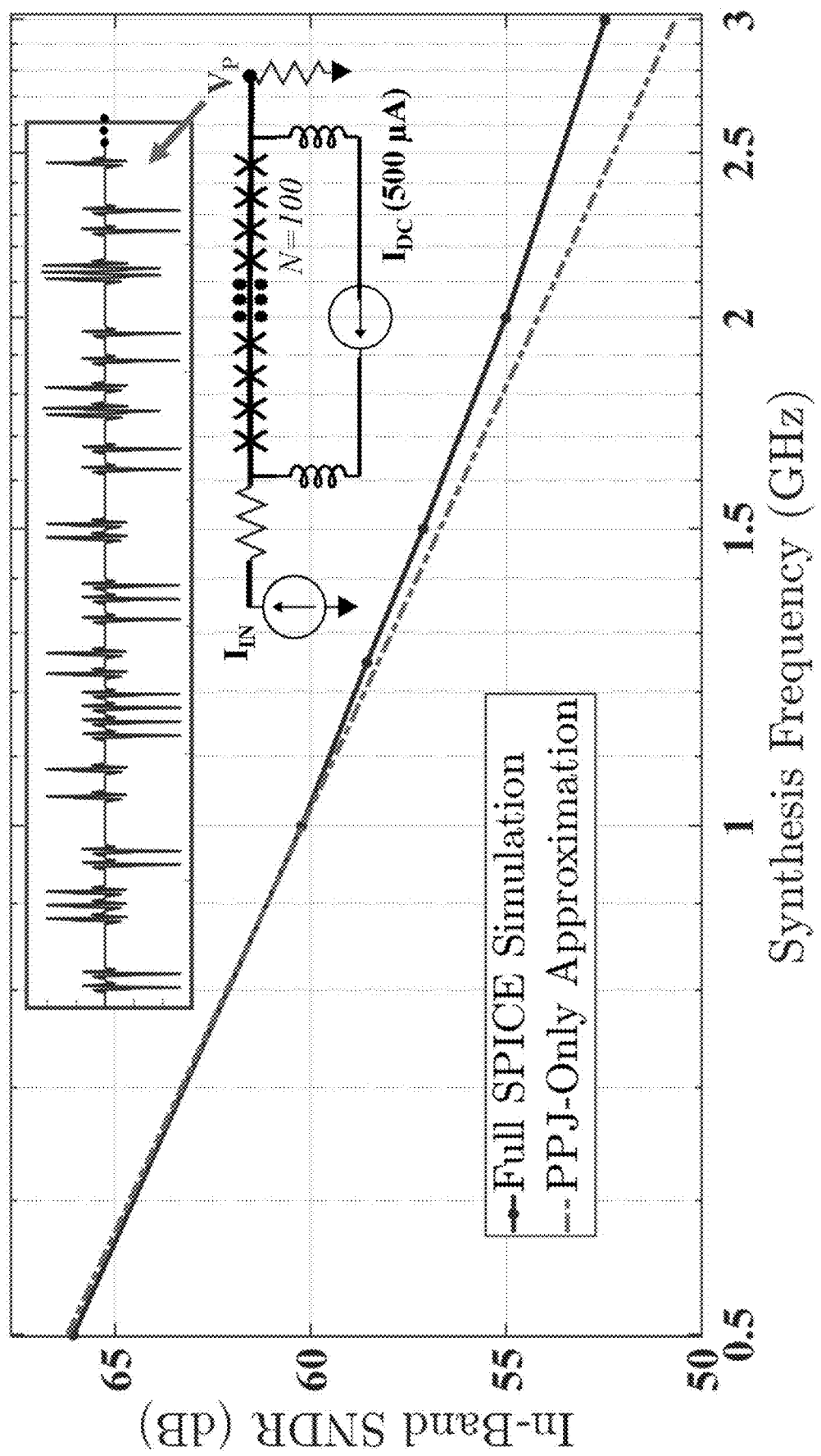
FIG. 11 shows a graph of in-band SNDR versus synthesis frequency for simulated jitter-contributed in-band SNDR for simplified deterministic PPJ model with $\Delta t=1.8$ ps and a full SPICE simulation when Idc=500 µA for synthesized tones in a range of 500 MHz 3 GHz. A 100-JJ circuit diagram used in SPICE and a sample of the output waveform are also shown.

In FIG. 11, the jitter-contributed SNDR of the SPICE output waveform is compared to the computed SNDR, when fixed, polarity-dependent 1.8 ps bit shifts are applied to the deltasigma code according to the PPJ model. SPICE simulations indicate that at frequencies above 1 GHz, SNDR due to Id≠0 remains higher than that predicted by (4). The magnitude of the relative phase delay used to define Δt decreases below 1.8 ps at frequencies between 1 and 3 GHz.

SPICE simulations show an amplitude loss of nearly 10,000 μV/V at 1 GHz even when Idc=0, which is greater than the incremental amplitude loss contributed by nonzero Idc. Deviation occurs between programmed amplitude and simulated output amplitude because the encoded spectrum of w[n] is scaled by the spectrum of P(t) at the JAWS output. The quantized pulse area in the time domain means that the f=0 component of the pulse spectrum [P(f)] is also quantized. The spectrum is flat and remains equal to its f=0 value up to hundreds of megahertz but rolls off at higher frequency. Because this roll-off has not been calibrated, it represents a source of additional uncertainty. The uncertainty can be reduced with the calibration measurements of the pulse spectrum P(f) and with the use of JJs that have shorter characteristic pulse time (i.e., higher IcRs).

With regard to experimental verification up to 3 MHz, generation of a second harmonic tone due to nonzero Idc was experimentally observed for single-tone waveforms in the 100 kHz-3 MHz frequency range. The superconducting JAWS chip used in these experiments was fabricated at the NIST Boulder Microfabrication Facility using a niobium-silicon process. The JAWS chip contained an array of N=5100 series-connected JJs. The chip was placed in a cryogenic-compatible measurement probe and immersed in liquid helium at ~4 K. The voltage across the array was measured with a 15 MSa/s digitizer, which limited experimental values f0 to <3.75 MHz so that the second harmonic would remain below the Nyquist frequency. After tuning the JAWS system input parameters to maximize the quantum locking range, Idc was stepped from 1.5 to 1.5 mA, and 1000-time traces, each spanning 1000 periods of the synthesized sinusoid, were acquired and averaged in the frequency domain. Synthesized was low-voltage output waveforms with an amplitude of 19.7 mV.

Figure 12:
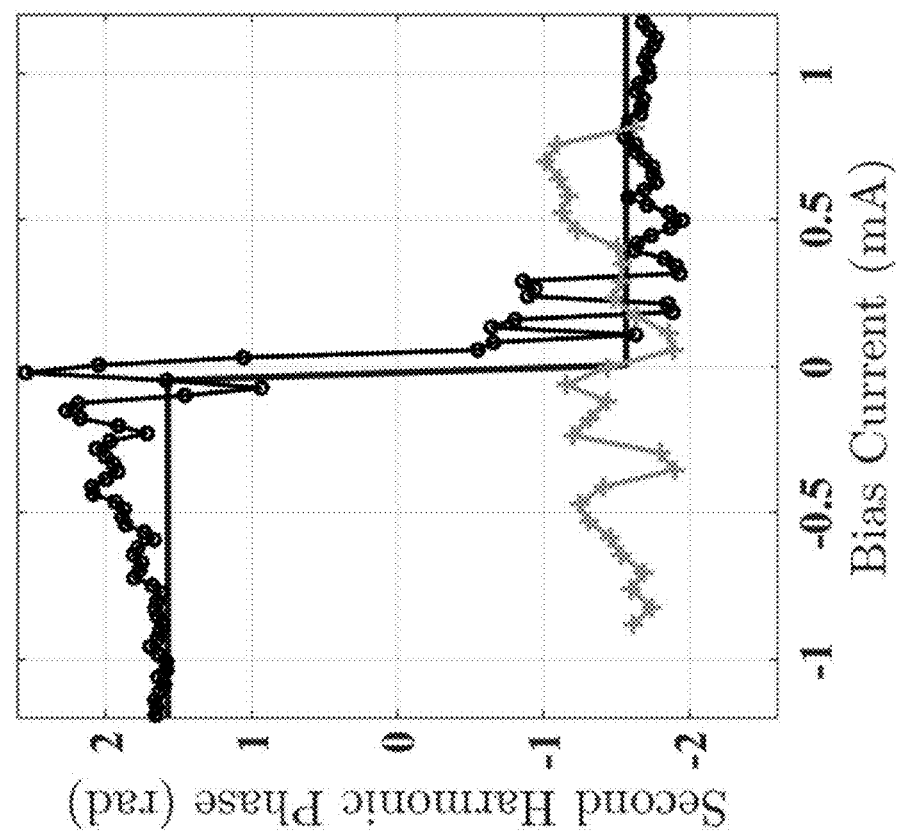
FIG. 12 shows in panel (a) a graph of second harmonic amplitude versus bias current Inc for measured (open circle) and simulated (solid line) second harmonic amplitude for a synthesized signal at f0=100 kHz with a bipolar input encoding. Also shown are the $I_{DC}$-dependent experimental data with a unipolar input encoding (small crosses). Panel (b) shows a graph of second harmonic phase versus $I_{DC}$ for measured and simulated second harmonic phase for a synthesized signal at f0=100 kHz with a bipolar encoding and measured second harmonic phase with a unipolar encoding.
Figure 12:
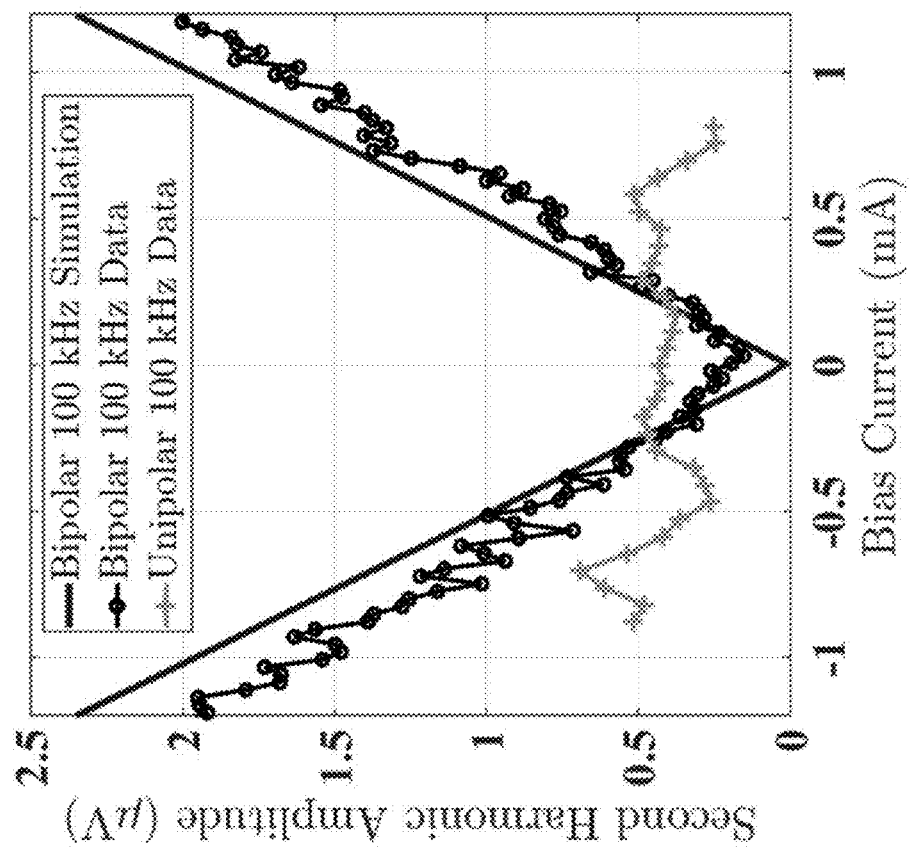

The nonlinearity of the digitizer produced a strong second harmonic in the output data, even when Idc=0. The incremental second harmonic tone that was produced due to deterministic PPJ at Id≠0 added vectorially to this preexisting digitizer spur. To extract the Idc-dependent portion of the data, subtracted was the phase and magnitude of the measured second harmonic at Idc=0 from the measured phase and magnitude of the second harmonic at all other bias points. The remaining Idc-dependent portion of the data had magnitude and phase that were well matched to simulations. A comparison between the experimental and simulated phase and magnitude of the Idc-dependent second harmonic signal is shown in FIG. 12 for a 100 kHz fundamental tone.

Polarity-dependent, deterministic PPJ affects the spectrum of the output waveform because bipolar delta sigma encodings are used. If instead was used a unipolar (0, +1) encoding scheme, a nonzero Idc would cause a uniform advance (or delay) of all pulses, which would not distort the output waveform but would reduce the output amplitude by a factor of two. This may be a necessary step to eliminate PPJ in the design of JAWS circuits for RF calibration systems. In FIG. 12, also shown is trends in the second harmonic amplitude and phase with Idc for a 1 bit, unipolar 100 kHz waveform encoding, over the quantum locking range. The absence of any observable dependence on Idc confirms that the second harmonic generation depends on the bipolarity of the input pulses.

Figure 13:
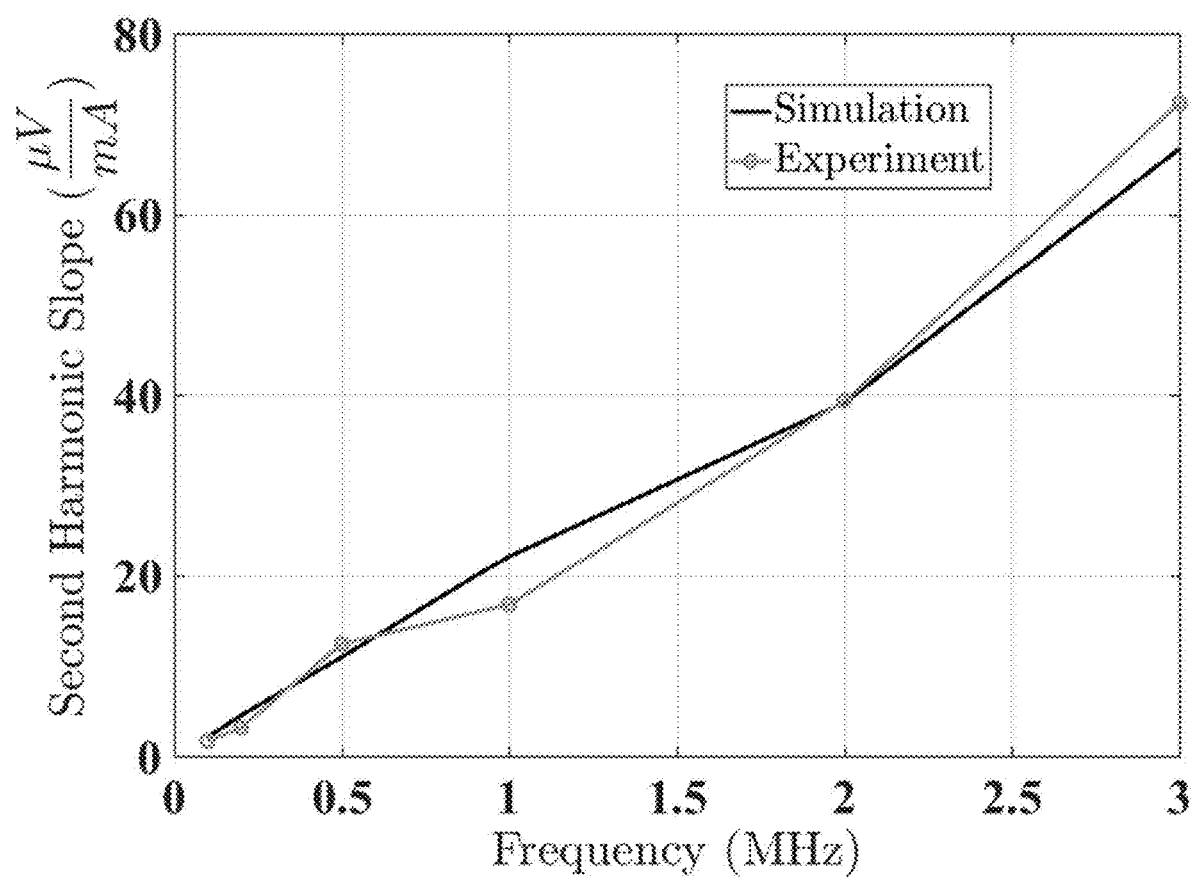
FIG. 13 shows a graph of second harmonic slope versus frequency for simulated and measured slope of second harmonic amplitude at 1 mA bias current. Measurements were performed at 4 K, and the same chip was measured for this plot and for FIG. 12.

Finally, when using bipolar waveform encodings, the experimental frequency dependence of the Idc-dependent second harmonic slope (μV/mA) with bias current also matches simulation results. In FIG. 13, a comparison between the measurement and simulation of the slope of the second harmonic at 1 mA bias current is shown for a range of synthesis frequencies. Slopes of both the experimental and simulation data are normalized to the amplitude of f0. The simulations use the mapping of Δt—versus—Idc that is shown in FIG. 8, and no additional free parameters are varied.

With regard to random jitter, quantized-area JAWS output pulses do not have PWJ, and random timing jitter only leads to PPJ. Here quantified is impact of random PPJ on the SNDR and on the amplitude of the fundamental tone f0. Compared is these impacts with the effects of random timing jitter on ZOH DAC systems subject to PWJ.

With regard to sources of random jitter, a source of random PPJ in the JAWS system is the input pattern generator and the input waveform amplifier. Based on specifications for the full chain of input electronics, an overall rms random jitter in the output pulses was 200-300 fs.

Random PPJ due to thermal noise in the cryogenic superconducting circuit components is negligible compared to noise from the room temperature input electronics.

With regard to theoretical effect of random jitter, the following is a model for JAWS output in the presence of random PPJ:

$$Vp,jit(t)=P(t)\otimes \Sigma nw[n]\delta(t-nT-e\hat{}n) \quad (8)$$

where e^n represents the random timing jitter and is assumed to be white. Its amplitude has a Gaussian distribution with a mean of zero and standard deviation σ.

In contrast, the PWJ that affects ZOH DACs according to the model $$vzoh(t)=u(t)\otimes n\Delta w[n]\delta(t-nTs-e\hat{}n) \quad (9)$$

where u(t) is the unit step function and Δw[n]=w[n]−w[n−1]. Effects of random timing jitter for the JAWS system with the noise model are per (8) substituted in place of the model in (9).

Figure 14:
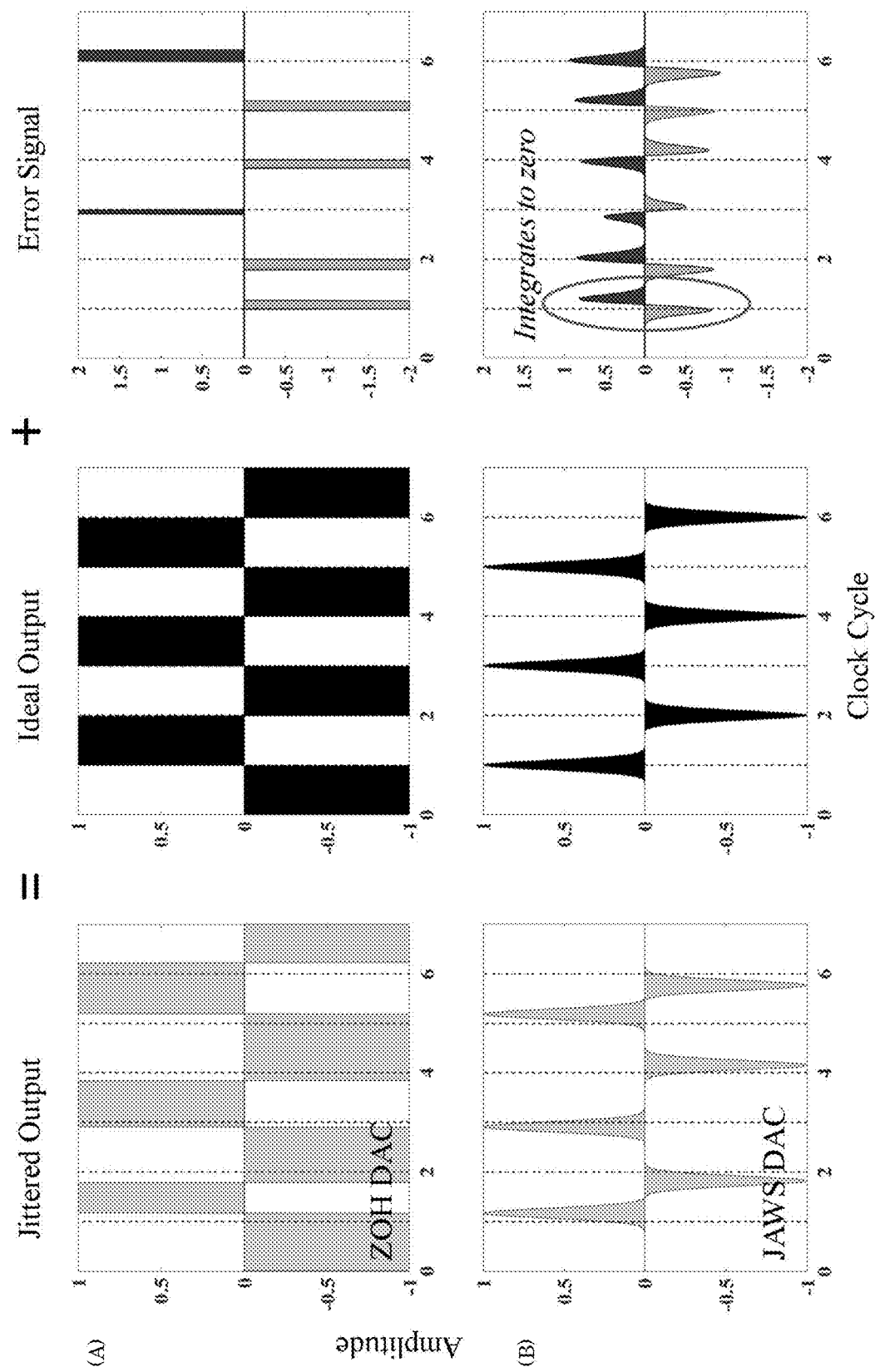
FIG. 14 shows graphs of normalized amplitude versus clock cycle for (A) output of a ZOH DAC affected by random timing jitter that is broken into a summation of ideal output and error signal. (B) Output of a JAWS DAC affected by the random timing jitter that is broken into ideal output and error signal. For JAWS, an area of the error signal is zero over a timescale of a single pulse.

In FIG. 14(a), a sample ZOH DAC output signal subjected to random jitter is broken into a summation of ideal output and error signal.

The PPJ-perturbed JAWS output signal is also shown in FIG. 14(b) as a summation of an ideal signal and an error signal. Unlike for a ZOH DAC, the integrated area of the error signal is always zero over the time scale of a single output pulse. This feature has a high-pass filtering effect on the power spectral density (PSD) of the error signal.

For both JAWS and a ZOH DAC, the PSD of the jittered output is a sum of the PSD of the ideal signal, the PSD of the error signal, and a cross correlation term. The cross-correlation term in the PSD of the jittered output results in loss in power from the fundamental tone. Power is redistributed into the continuous-frequency noise PSD of the error signal.

With regard to decrease in amplitude of fundamental tone, for the JAWS system (subject to PPJ) and ZOH DACs (subject to PWJ), the fractional decrease in amplitude of the fundamental tone f0 is $$0<(|C(f0)|-1)<1 \quad (10)$$

where $|C(f0)|=e-(1/2)(2\pi f0\sigma)2$ for the timing noise model.

Figure 15:
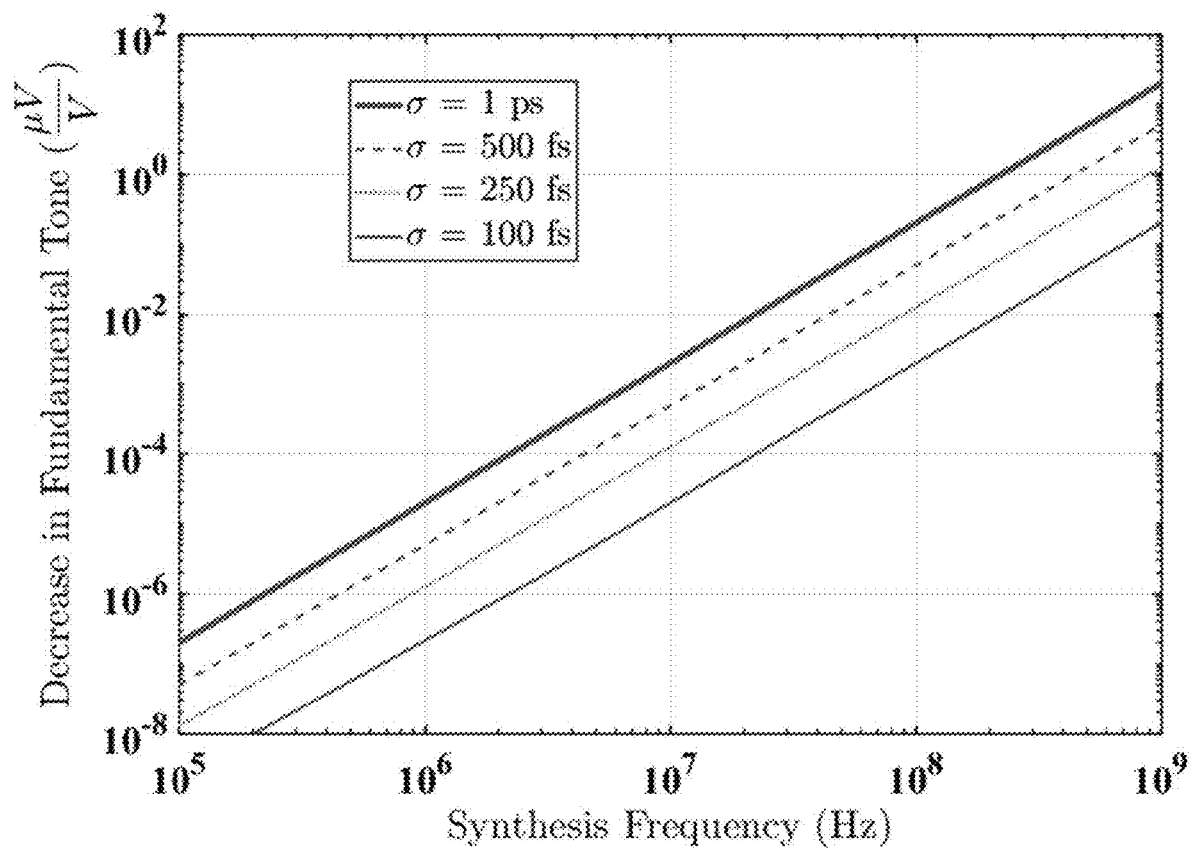
FIG. 15 shows a graph of decrease in fundamental tone amplitude versus synthesis frequency with random timing jitter. A Gaussian distribution was used for jitter with a standard deviation (σ) of 100 fs, 250 fs, 500 fs, and 1 ps.

This fractional decrease in amplitude is shown in FIG. 15 at a range of σ. Random jitter in the JAWS system is ~250 fs. Given this jitter magnitude, the decrease in amplitude at 1 GHz is ~1 ppm and within an acceptable error range for the JAWS system.

With regard to noise error power spectrum, to calculate in-band SNDR in the presence of random noise, the noise PSD is integrated over a 10 MHz bandwidth that is centered at the fundamental tone. The closed-form expressions for SNDR given below assume that PSD(f) varies negligibly over the narrow 10 MHz bandwidth so that PSD(f) PSD(f0) in the range f=f0±5 MHz. Full integrals of PSD were computed for FIG. 16.

For the JAWS DAC, we find that $$SNDR(f0)\approx 10 \log 10(2OSRA(1-|C(f0)|2)) \quad (11)$$

where A is the dimensionless ratio of total power in the deltasigma code to power in the fundamental tone (typically 9-10), and the oversampling ratio is defined by fc/2BW, where fc is the clock frequency (28 GHz) and BW is the code bandwidth (10 MHz).

For a ZOH DAC, the SNDR in the presence of random timing jitter is $$SNDR(f0)\approx 10 \log 10(4OSR(\sin(\pi f0/fc))2A(1-|C(f)|2)). \quad (12)$$

Figure 16:
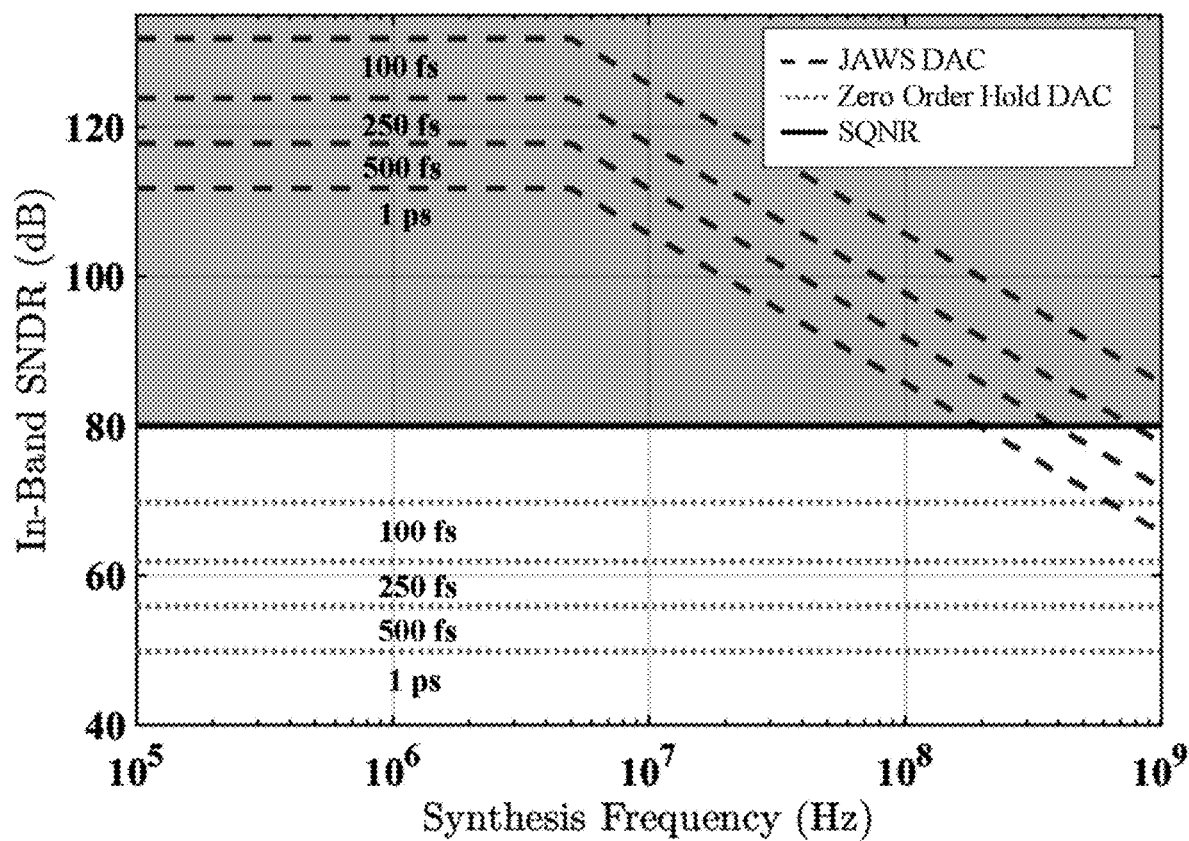
FIG. 16 shows a graph of in-band SNDR (JAWS DAC in long dashes and ZOH DAC in short dashes) versus frequency with noise contributed by random timing jitter for different values of the standard deviation a of the jitter distribution. SQNR of 80 dB for the input delta sigma code is also shown. SNDR is constant below 5 MHz because the noise is integrated over a 10 MHz bandwidth.

In FIG. 16, the in-band random jitter-contributed SNDR is shown for a JAWS DAC versus a ZOH DAC for several values of a in the output frequency range of 100 kHz to 1 GHz and assuming fc=28 GHz. The target baseline in-band SQNR of the input deltasigma encoding is also shown.

Noise due to the random jitter error signal is shaped to high frequencies with the JAWS DAC, and SNDR, therefore, decreases with frequency but is universally higher than the ZOH DAC SNDR in the range of f/fc shown. In contrast, the noise due to random PWJ for the ZOH DAC more closely approximates white noise, and jitter-contributed SNDR is nearly constant even at frequencies near dc.

Figure 17:
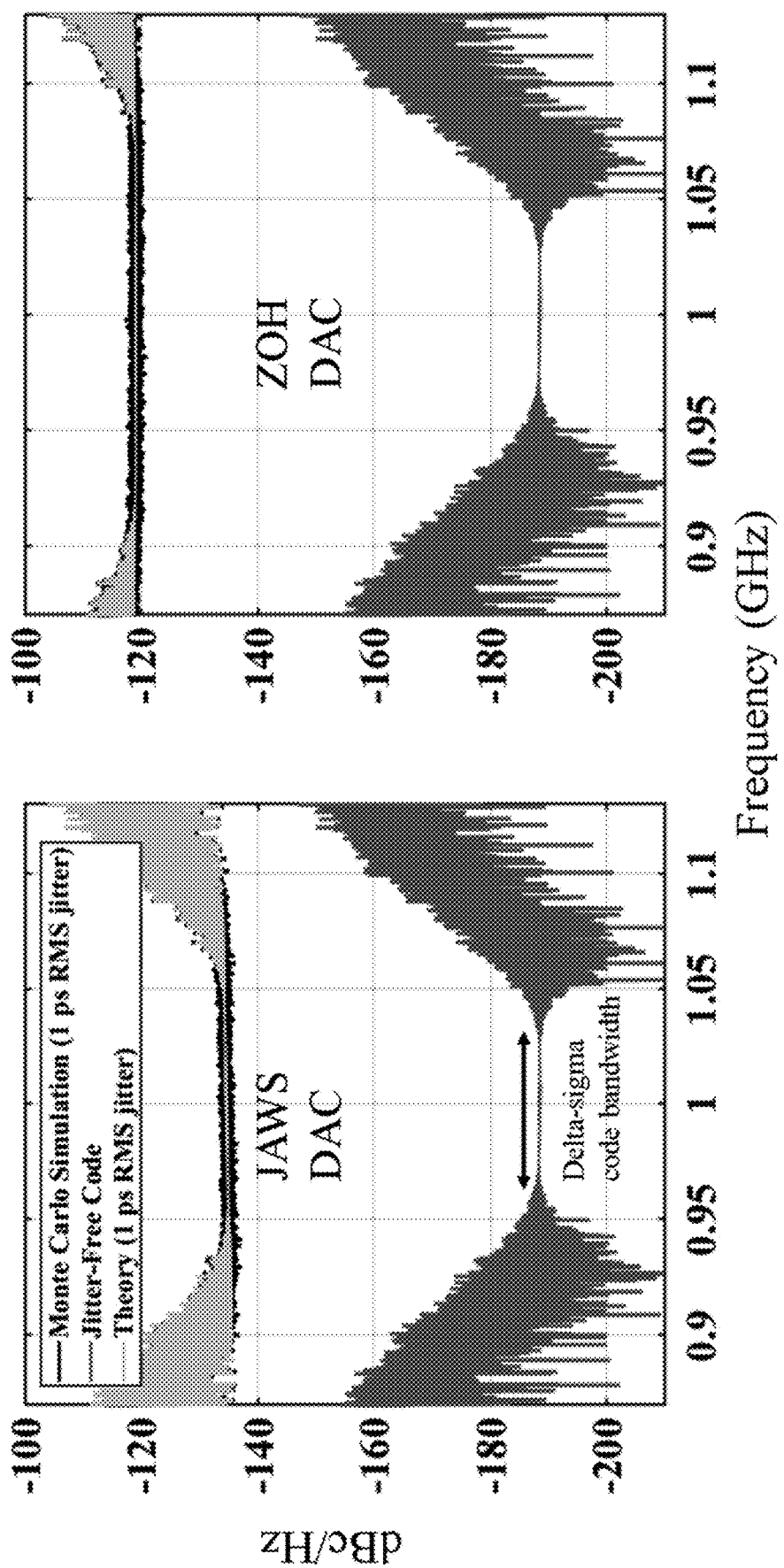
FIG. 17 shows (a) a comparison between Monte Carlo simulation and theoretical formula for noise PSD of a 1 GHz deltasigma code due to 1 ps rms random PPJ in JAWS DAC output pulses. Baseline PSD due to quantization noise in the jitter-free code is also shown. Panel (b) shows a comparison between simulation and theory for the same deltasigma code subject to random 1 ps rms PWJ, as in a ZOH DAC output.

With regard to verification with Monte Carlo simulation, to verify the derived random noise power spectrum and SNDR for deltasigma DACs subject to random PPJ or random PWJ, Monte Carlo noise simulations were made. The correspondence between simulated and theoretical noise PSDs in the presence of random timing jitter is shown in FIG. 17.

For these simulations, first generated was an ideal, three-level, 10th-order deltasigma encoding of a 1 GHz waveform with 100 MHz bandwidth. To simulate PPJ in the JAWS system, each bit in the deltasigma code was substituted with a SPICE-simulated SFQ pulse waveform. Each pulse was offset by a random value selected from a Gaussian distribution with σ=1 ps and mean of 0. For the ZOH DAC simulation of PWJ, the ideal transition times between deltasigma code levels were perturbed by the same randomly selected time offsets. In both the cases, the process was repeated 70 times, and the resulting power spectra were averaged. To compute PSD, divided was the simulated noise power in a given frequency bin by the frequency bin spacing (20.8 kHz in these simulations).

Observed was a match between theoretical PSD and simulation results for both PPJ and PWJ, which confirms the validity of the derived expressions in (11) and (12).

Simulations of random and deterministic jitter show that the JAWS system can be extended to synthesis above 1 GHz and maintain amplitude accuracy <2000 μV/V, assuming that timing jitter is the only source of uncertainty in the system. This result is a component of an overall JAWS amplitude accuracy analysis.

Other non-jitter-related sources of uncertainty can be prevalent at microwave frequencies. In particular, before the JAWS system is disseminated as a microwave-frequency voltage standard, the frequency-dependent uncertainty in P(f) is bounded. The JAWS system can be deployed for applications that involve a linear and low-distortion waveform source, wherein sources of deterministic jitter that generate in-band spurious content are excluded.

Unipolar encodings avoid Idc-dependent deterministic jitter although this encoding scheme reduces the amplitude of f0 by a factor of two. The number of JJs can be doubled to recover the full amplitude but doubling the array length achieves a uniform pulse drive amplitude for all JJs, and standing waves become involved as the electrical length of the array approaches the synthesis frequency wavelength.

To keep array length constant and double the number of arrays, dedicate each array to a single polarity. This involves driving two arrays with opposite polarity inputs and measuring a difference between their outputs (e.g., with an on-chip 180° phase shift element followed by a power combiner, both designed for a center frequency of f0). Such a technique eliminates effects of jitter due to Id≠0, but insertion loss of additional circuitry can degrade amplitude accuracy.

Deterministic jitter can be reduced by decreasing the characteristic pulse time of the JJs by increasing the IcRs product. Faster junctions have a smaller Δt for a given value of Idc. However, the benefit of faster JJs are realized with a faster pulse drive and higher input bandwidth in the pulse delivery system, both of which are RF engineering issues.

At microwave frequencies, tradeoffs occur between single-tone accuracy, spectral purity, output amplitude, and restricting the operational quantum-locked space to a smaller range of Idc. Microwave JAWS circuits can include an array of pulse-quantizing JJs, and additional circuit details can be varied and optimized depending upon the application.

JAWS can generate single tones up to 1 GHz while maintaining amplitude uncertainty below the 2000 μV/V metric set by ac rms power calibration services, even in the presence of deterministic and random PPJ. In addition, lack of random output PWJ in the JAWS circuits allows the device to achieve superior random jitter sensitivity relative to ZOH DAC, although this advantage diminishes with higher output frequency unless clock frequency is also increased. Finally, quantized pulse areas may not protect the JAWS system against spurious tone generation due to deterministic PPJ. Deterministic PPJ may cause measurable variation in the output waveform over the quantum-locking range and can be eliminated either by changing the circuit architecture or restricting the input polarity.

With regard to analytical treatment of deterministic jitter, the output waveform in the presence of polarity-dependent jitter is written as $$Vp,jit(t)=p(t)\otimes \Sigma nw[n]\delta(t-nT+\Delta t(Idc)w[n]). \quad (13)$$

In the frequency domain, $$Vp,jit(t)=\Sigma n=0\infty |an|\sin(2\pi fnt+\phi n+(2\pi fn\Delta t)Vp(t)) \quad (14)$$

where $\phi n$ and $|an|$ are the phase and amplitude of a particular Fourier component in the unshifted output Vp(t). The jittered output is now conveniently expressed as a summation of the frequency components in the original encoding, each of which has been phase-modulated by the function $(2\pi fn\Delta t)$ Vp(t). The effects of single-tone phase modulation of a single-tone signal are extended in this analysis to multitone modulation of a multitone signal to provide an analytical framework for the effect of deterministic, polarity-dependent jitter on the output spectrum.

The output waveform Vp(t) in the absence of jitter contains a sum of sinusoidal terms with frequencies fn, phases $\phi n$, and amplitudes an. When polarity-dependent jitter is present due to Id≠0, each tone fn is modulated by the same waveform Vp(t), scaled by a factor of $2\eta\Delta tfn$. The modulation waveform Vp(t) contains frequency components fk with phases $\phi k$ and amplitudes ak, which are in general the same as those in the original output.

The impact of multitone phase modulation on a particular tone fn is, to first order in a Jacobi-Anger expansion, expressed as $$Im\{|an|ei(2\pi fnt+\phi n)\}\text{-}\!\!\rightarrow\text{-----Phase Mod}Im\{|an|ei$$
$$(2\pi fnt+\phi n)\Pi k(J0(ak2\pi\Delta tfn)+|ak|\pi fn\Delta t(ei(2\pi fkt+$$
$$\phi k)-e-i(2\pi fkt+\phi k)))\}. \quad (15)$$

As an example, if the output Vp(t) in the absence of deterministic jitter was only composed of frequency components f0 (the fundamental tone), f1, and f2, with amplitudes a0, a1, and a2 and phases $\phi 0$, $\phi 1$, and $\phi 2$, respectively, then the direct impact of phase modulation on the fundamental tone $a0\sin(2\pi f0t+\phi 0)$ would be $$Im\{|a0|ei(2\pi f0t+\phi 0)\}\text{-}\!\!\rightarrow\text{-----Phase Mod}Im\{|a0|ei$$
$$(2\pi f0t+0)\times(J0(a02\pi\Delta tf0)+|a0|\pi f0\Delta t(ei(2\pi f0t+$$
$$\phi 0)-e-i(2\pi f0t+\phi 0)))\times(J0(a12\pi\Delta tf0)+|a1|\pi f0\Delta t(ei$$
$$(2\pi f1t+\phi 1)-e-i(2\pi f0t+\phi 1)))\times(J0(a22\pi\Delta tf0)+$$
$$|a2|\pi f0\Delta t(ei(2\pi f2t+\phi 2)-e-i(2\pi f2t+\phi 2)))\} \quad (16)$$

with analogous expressions holding for the impact of phase modulation on each of the other two spectral components. When expanding the products in (16), to the first order, we ignore the terms of order $\Delta t2$. Then, it follows that the first-order impact of multitone phase modulation on the fundamental tone is to change its amplitude from $|a0|$ to:

$$==|a0|(J0(a02\pi\Delta tf0)\times J0(a12\pi\Delta tf0)\times J0(a22\pi\Delta tf0))$$
$$|a0|\Pi fm(J0(am2\pi\Delta tf0))|a0|(1-\alpha(f0)) \quad (17)$$

where $$a(f0)=1-\Pi fm(J0(am2\pi\Delta tf0)) \quad (18)$$

which is the same as (6). In this example m∈1-3, however, the result generalizes to an arbitrary number of frequency components. The Bessel function J0(x) falls below one as its argument grows large, which means that the attenuation of a tone grows with increasing fn and $\Delta t$. Assuming that a0 is the dominant amplitude in the waveform spectrum, while a1 and a2 represent quantization noise in a deltasigma encoding, the term $J0(a02\pi\Delta tf0)$ dominates the attenuation factor. The exact deltasigma noise shaping properties and corresponding amplitudes of a1 and a2 have negligible impact on the overall attenuation.

In addition, (16) indicates that new spectral components are generated from the modulated tone f0 at frequencies f0+f0, |f0±f1|, and |f0±f2|, with amplitudes and phases that can be read from the equation. Correspondingly, the phase modulation of frequency component f1 will generate spectral content at frequencies f1+f1, |f1±f0|, |f1±f2|, and so on.

The waveform Vp(t) has frequency components at evenly spaced intervals, and their mixing will generate spectral content only within the original frequency grid. For example, if f1 and f2 represent the harmonics of f0, then new frequency content will be generated at the tone f1 due to the mixing components |f2−f0|, |f0−f2|, and f0+f0. This is the source of the term $\Delta a,m$.

For f1=2f0, the spectral component contributed to $\Delta a,m$ by f0+f0 is large in magnitude, because its amplitude is proportional to $|a0|2$, and the fundamental tone amplitude a0 is, by design orders of magnitude, larger than any other quantization noise tone in the output spectrum. This explains the strong second harmonic generation.

For other tones fn within the spectral range of interest (up to ~1 GHz), the main contribution to $\Delta a,m$ will be mixing of all frequency pairs (fi and fj), whose difference fj−fi is equal to fn, rather than additive mixing-up of low-frequency components of Vp(t). If fi<fj, then the phase modulation of fi by frequency component fj generates a sinusoidal signal at frequency fn with amplitude $|ai||aj|\pi fi\Delta t$ and phase $\phi j-\phi i$. Similarly, the phase modulation of fj by frequency component fi generates a sinusoidal signal at frequency fn with amplitude $-|aj||ai|\pi fj\Delta t$ and phase $\phi j-\phi i$. The net amplitude of these two contributions to $\Delta a,m$ is $$|ai||aj|\pi fi\Delta t-|aj||ai|\pi fj\Delta t==|aj||ai|\pi(fi-fi)\Delta t-$$
$$|aj||ai|\pi fn\Delta t. \quad (19)$$

To find the total magnitude and phase of $\Delta a,m$ from the contribution of all frequency pairs (fi,fj), we take the summation over the full spectrum of Vp(t)

$$\Delta a,m=\Sigma n-\pi fn\Delta t|aj||ai|e\phi j-\phi i \quad (20)$$

which explains the average linear scaling of $\Delta a,m$ with fn and $\Delta t$.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity). The conjunction "or" is used to link objects of a list or alternatives and is not disjunctive; rather the elements can be used separately or can be combined together under appropriate circumstances.

What is claimed is:

1. A superconducting waveform synthesizer to produce an arbitrary waveform, the superconducting waveform synthesizer comprising:
   a primary Josephson junction that:
      receives a primary current bias pulse that consists essentially of a positive-polarity current pulse; and
      produces a primary quantized output pulse from the primary current bias pulse; a secondary Josephson junction that:
      receives a secondary current bias pulse that consists essentially of a negative-polarity current pulse; and
      produces a secondary quantized output pulse from the secondary current bias pulse;
   a combiner that:
      receives the primary quantized output pulse from the primary Josephson junction;
      receives the secondary quantized output pulse from the secondary Josephson junction; and
      produces a quantized pulse pattern from a combination of the primary quantized output pulse and the secondary quantized output pulse;
   a converter that:
      receives the quantized pulse pattern from the combiner; and
      produces the arbitrary waveform from the converter.

2. The superconducting waveform synthesizer of claim 1, further comprising an encoder that produces a bitstream and communicates the bitstream to a pattern generator that comprises a primary generator and the secondary generator.

3. The superconducting waveform synthesizer of claim 1, wherein the arbitrary waveform comprises a convolution of the quantized pulse pattern, the primary current bias pulse, and the secondary current bias pulse.

4. The superconducting waveform synthesizer of claim 1, wherein the primary Josephson junction produces one primary quantized output pulse per primary current bias pulse, and a voltage area of each primary quantized output pulse is equal to h/2e, wherein h is Planck's constant and e is an elementary charge of an electron.

5. The superconducting waveform synthesizer of claim 1, wherein the secondary Josephson junction produces one secondary quantized output pulse per secondary current bias pulse, and a voltage area of each secondary quantized output pulse is equal to h/2e, wherein h is Planck's constant and e is an elementary charge of an electron.

6. A superconducting waveform synthesizer to produce an arbitrary waveform, the superconducting waveform synthesizer comprising:
   an encoder that produces a bitstream;
   a pattern generator that receives the bitstream from the encoder and produces a primary current bias pulse from the bitstream, wherein the primary current bias pulse consists essentially of a positive-polarity current pulse;
   a primary Josephson junction that receives the primary current bias pulse from the pattern generator and produces a primary quantized output pulse from the primary current bias pulse; and
   a converter that receives the primary quantized output pulse from the primary Josephson junction and produces an arbitrary waveform from the primary quantized output pulse.

7. The superconducting waveform synthesizer of claim 6 further comprising:
   a secondary Josephson junction that receives a secondary current bias pulse from the pattern generator and produces a secondary quantized output pulse from the secondary current bias pulse;
   a combiner that receives the primary quantized output pulse from the primary Josephson junction, receives the secondary quantized output pulse from the secondary Josephson junction, and produces a quantized pulse pattern from a combination of the primary quantized output pulse and the secondary quantized output pulse; and
   a second converter that receives the quantized pulse pattern from the combiner and produces the arbitrary waveform from the converter.

8. The superconducting waveform synthesizer of claim 6, wherein the primary current bias pulse consists essentially of a positive-polarity current pulse.

9. The superconducting waveform synthesizer of claim 7, wherein the secondary current bias pulse consists essentially of a negative-polarity current pulse.

10. The superconducting waveform synthesizer of claim 7, wherein the arbitrary waveform comprises a convolution of the quantized pulse pattern, the primary current bias pulse, and the secondary current bias pulse.

11. The superconducting waveform synthesizer of claim 6, wherein the primary Josephson junction produces one primary quantized output pulse per primary current bias pulse, and a voltage area of each primary quantized output pulse is equal to h/2e, wherein h is Planck's constant and e is an elementary charge of an electron.

12. The superconducting waveform synthesizer of claim 7, wherein the secondary Josephson junction produces one secondary quantized output pulse per secondary current bias pulse, and a voltage area of each secondary quantized output pulse is equal to h/2e, wherein h is Planck's constant and e is an elementary charge of an electron.

13. A process for producing an arbitrary waveform with the superconducting waveform synthesizer, the process comprising:
producing a bitstream;
producing a primary current bias pulse from the bitstream, wherein the primary current bias pulse consists essentially of a positive-polarity current pulse;
communicating the primary current bias pulse to a primary Josephson junction;
receiving, by the primary Josephson junction, the primary current bias pulse;
producing, by the primary Josephson junction, a primary quantized output pulse from the primary current bias pulse;
producing a primary quantized output pulse from the primary current bias pulse; and
producing an arbitrary waveform from the primary quantized output pulse.

14. The process for producing an arbitrary waveform of claim 13, further comprising:
producing a secondary current bias pulse from the bitstream;
communicating the secondary current bias pulse to a secondary Josephson junction;
receiving, by the secondary Josephson junction, the secondary current bias pulse; and
producing, by the secondary Josephson junction, a secondary quantized output pulse from the secondary current bias pulse.

15. The process for producing an arbitrary waveform of claim 14, the process further comprising:
combining the primary quantized output pulse and the secondary quantized output pulse to produce a quantized pulse pattern; and
converting the quantized pulse pattern to the arbitrary waveform to produce the arbitrary waveform.

16. The process for producing an arbitrary waveform of claim 14, further comprising:
producing, by a primary generator, the primary current bias pulse; and
producing, by a secondary generator, the secondary current bias pulse.

17. The superconducting waveform synthesizer of claim 13, wherein the primary current bias pulse consists essentially of a positive-polarity current pulse.

18. The superconducting waveform synthesizer of claim 14, wherein the secondary current bias pulse consists essentially of a negative-polarity current pulse.

19. The superconducting waveform synthesizer of claim 14, wherein the arbitrary waveform comprises a convolution of the quantized pulse pattern, the primary current bias pulse, and the secondary current bias pulse.

20. The superconducting waveform synthesizer of claim 14, wherein the primary Josephson junction produces one primary quantized output pulse per primary current bias pulse;
a voltage area of each primary quantized output pulse is equal to h/2e, wherein h is Planck's constant and e is an elementary charge of an electron;
the secondary Josephson junction produces one secondary quantized output pulse per secondary current bias pulse; and
a voltage area of each secondary quantized output pulse is equal to h/2e, wherein h is Planck's constant and e is an elementary charge of an electron.

21. A process for producing an arbitrary waveform, the process comprising:
communicating a primary current bias pulse to a primary Josephson junction, wherein the primary current bias pulse consists essentially of a positive-polarity current pulse;
receiving, by the primary Josephson junction, the primary current bias pulse;
producing, by the primary Josephson junction, a primary quantized output pulse from the primary current bias pulse;
communicating a secondary current bias pulse to a secondary Josephson junction, wherein primary current bias pulse that consists essentially of a negative-polarity current pulse;
receiving, by the secondary Josephson junction, the secondary current bias pulse;
producing, by the secondary Josephson junction, a secondary quantized output pulse from the secondary current bias pulse;
combining the primary quantized output pulse and the secondary quantized output pulse to produce a quantized pulse pattern; and
converting the quantized pulse pattern to the arbitrary waveform to produce the arbitrary waveform.

22. The process for producing an arbitrary waveform of claim 13, further comprising:
producing, by a primary generator, the primary current bias pulse; and
producing, by a secondary generator, the secondary current bias pulse.

23. The superconducting waveform synthesizer of claim 13, wherein the arbitrary waveform comprises a convolution of the quantized pulse pattern, the primary current bias pulse, and the secondary current bias pulse.

* * * * *